(12) United States Patent
Terashima et al.

(10) Patent No.: US 8,097,960 B2
(45) Date of Patent: Jan. 17, 2012

(54) SEMICONDUCTOR MOUNTING BONDING WIRE

(75) Inventors: Shinichi Terashima, Tokyo (JP); Tomohiro Uno, Tokyo (JP); Kohei Tatsumi, Tokyo (JP); Takashi Yamada, Saitama (JP); Atsuo Ikeda, Saitama (JP); Daizo Oda, Saitama (JP)

(73) Assignees: Nippon Steel Materials Co., Ltd, Tokyo (JP); Nippon Micrometal Corporation, Iruma (JP)

( * ) Notice: Subject to any disclaimer, the term of this patent is extended or adjusted under 35 U.S.C. 154(b) by 62 days.

(21) Appl. No.: 12/146,792

(22) Filed: Jun. 26, 2008

(65) Prior Publication Data

US 2009/0072399 A1 Mar. 19, 2009

(30) Foreign Application Priority Data

Jun. 28, 2007 (JP) .................................. 2007-170613
Jun. 23, 2008 (JP) .................................. 2008-163617

(51) Int. Cl.
*H01L 23/48* (2006.01)

(52) U.S. Cl. . 257/784; 257/741; 257/686; 257/E23.024; 438/686

(58) Field of Classification Search .................. 257/784
See application file for complete search history.

(56) References Cited

U.S. PATENT DOCUMENTS

| | | | | |
|---|---|---|---|---|
| 2002/0104682 A1 | * | 8/2002 | Park et al. ..................... | 174/255 |
| 2003/0209810 A1 | * | 11/2003 | Moon et al. ................... | 257/784 |
| 2006/0226546 A1 | * | 10/2006 | Inoue et al. ................... | 257/741 |
| 2007/0278634 A1 | * | 12/2007 | Cho et al. ..................... | 257/677 |

FOREIGN PATENT DOCUMENTS

| JP | 2000040710 A | * | 2/2000 |
|---|---|---|---|
| JP | 2007-027335 A | | 2/2007 |

OTHER PUBLICATIONS

Erik NES; Modelling of Work Hardening and Stress Saturation in FCC Metals; *Progress in Materials Science*, vol. 41, pp. 129 to 193, 1998.

M. Zehetbauer et al.; Cold Work Hardening in Stages IV and V of F.C.C. Metals—I. Experiments and Interpretation; *Acta metal. mater.*, vol. 41, No. 2, pp. 577-588, 1993.

* cited by examiner

*Primary Examiner* — Ajay K Arora
(74) *Attorney, Agent, or Firm* — McDermott Will & Emery LLP

(57) ABSTRACT

There is provided a bonding wire which does not cause a leaning failure or the like. A semiconductor mounting bonding wire has a breaking elongation of 7 to 20%, and stress at 1% elongation is greater than or equal to 90% of a tensile strength and is less than or equal to 100% thereof.

17 Claims, 1 Drawing Sheet

SEMICONDUCTOR MOUNTING BONDING WIRE

CROSS-REFERENCE TO RELATED APPLICATION

This application claims priority of Japanese Patent Application No. 2007-170613 filed Jun. 28, 2007 and Japanese Patent Application No. 2008-163617 filed Jun. 23, 2008, both of which are herein incorporated by reference in their entirety.

TECHNICAL FIELD

The present invention relates to a semiconductor mounting bonding wire which is used for connecting an electrode of a semiconductor device with a wiring of a circuit wiring substrate for the semiconductor device, such as a lead frame, a substrate, a tape, or the like.

BACKGROUND ART

Nowadays, thin lines having a line diameter of about 20 to 50 μm and formed of gold which has a 4N purity (99.99 mass %) and which has a superior electrical conductivity are mainly used as semiconductor mounting bonding wires (hereinafter called "bonding wire") connecting an electrode mainly formed of Al on a semiconductor device with a wiring on a semiconductor circuit wiring substrate, such as a lead frame, a substrate, or a tape. In general, the relationship between the elongation of a bonding wire and stress is often evaluated through a mechanical test called tensile test, maximum stress until the bonding wire breaks out in a measurement is called tensile strength, and a maximum elongation is called breaking elongation. Here, there is a common tendency that the larger the breaking elongation becomes, the smaller the tensile strength becomes. Normally, bonding wires are often set to have a breaking elongation of 4% or so, and it is generally thought that a strength sufficient for mounting a semiconductor device cannot be obtained if the breaking elongation is set to be greater than or equal to 7%. A relationship diagram for stress obtained through the tensile test and elongation is called tensile curve. A material elastically deforms at the beginning where stress is small, and the stress, which is at a point where the stress becomes large and the material starts permanent deformation called plastic deformation, is called yield stress.

In general, a method called ball bonding is used to connect both a bonding wire and the electrode, and a method called wedge bonding is used to connect both a bonding wire and a wiring on the semiconductor circuit wiring substrate. According to the ball bonding, the leading end of a bonding wire is subjected to arc heat input to melt the leading end thereof, the meltage is solidified using surface tension to form a ball called initial ball at the leading end, the initial ball and the electrode are heated within a range from 150 to 300° C. while ultrasonic wave is applied thereto to fix those by applying pressure, thereby bonding the bonding wire and the electrode. On the other hand, according to the wedge bonding, while a bonding wire is directly heated to a temperature from 150 to 300° C., ultrasonic wave is applied to fix the bonding wire and the wiring on the substrate by applying pressure, thereby bonding the bonding wire on the wiring on the substrate. Note that a portion having undergone the ball bonding is often called first bonding (hereinafter, "1st bonding") part, and a portion having undergone the wedge bonding is often called second bonding (hereinafter, 2nd bonding") part. Recently, in response to the needs for high densification of a semiconductor device, miniaturization, thinning and the like, a case where a resin-based semiconductor circuit wiring substrate (e.g., BGA: Ball Grid Array substrate) is used instead of a lead frame used widely and conventionally increases. In general, when the resin-based substrate is used, it is necessary to bond a bonding wire at a lower temperature than that of the conventional lead frame (about 250° C. for the lead frame, and about 150° C. for the resin-based substrate).

A semiconductor device is packaged through a so-called resin encapsulation process of filling a thermosetting epoxy resin after a bonding wire is bonded to an electrode or a wiring and of solidifying the resin. At this time, there is the possibility of a wire sweep failure that a bonding wire abnormally deforms because of a filling resin and adjoining bonding wires contact with each other and shorted in the worst case. The general factor of this failure is because of the lack of the mechanical strength of a bonding wire, and it is important to suppress a failure (leaning failure) that a bonded bonding wire leans in a direction of an adjoining bonding wire. Accordingly, it is generally thought that ensuring a certain strength of a bonding wire is important. In order to do so, a bonding wire is often set to have a breaking elongation of 4% or so to enhance the strength (see patent literature 1).

Further, in regard to the 2nd bonding part, failures, such as peeling and disconnection, inherent to the lack of bonding strength often occur, and in such cases, the long-term reliability of the 2nd bonding part becomes insufficient. Accordingly, bonding wires often require a scheme which ensures a sufficient long-term reliability at a 2nd bonding part.

[Patent Literature 1] Unexamined Japanese Patent Application No. 2007-27335

DISCLOSURE OF INVENTION

Problem to be Solved by the Invention

Because of the needs for high densification of a semiconductor device to be mounted, miniaturization, thinning and the like, there is a strong tendency that a bonding wire is thinned so as to have a line diameter of less than or equal to 25 μm, further, less than or equal to 20 μm, and in accordance with this thinning, the cross-sectional area of a bonding wire becomes small. In general, the tensile strength of a bonding wire is a value obtained by multiplying the tensile strength of the bonding wire per unit area by a cross-sectional area. Therefore, as the cross-sectional area of a bonding wire becomes small by thinning, a tensile strength requisite for the bonding wire is not ensured even if there is no problem with the tensile strength of the bonding wire per unit area, so that the leaning failure and the wire sweep failure often occur, and it is considered as a problem. To overcome this problem, the tensile strength of a bonding wire per unit area must be increased. As explained above, because of the relationship between the breaking elongation of the bonding wire and the tensile strength thereof, it is expected to increase the tensile strength of the bonding wire by reducing the breaking elongation thereof, but a phenomenon called wire curling occurs if the breaking elongation of the bonding wire is too small, and the bonding wire cannot be wired.

FIGS. 1 to 3 of the patent literature 1 indicate a tensile strength in which the elongation of a bonding wire is 6.4% at maximum, but because the tensile strength of a bonding wire decreases as the elongation of the bonding wire becomes large, the bonding wire is normally set to have an elongation of 4% or so to ensure the tensile strength thereof, and in particular, according to the patent literature 1, the elongation of the bonding wire is set to about 2%.

In order to increase the tensile strength of a bonding wire, a method of adding additive elements in a bonding wire at a higher contained amount than the conventional one is widely used. However, although the tensile strength of a bonding wire is sufficiently enhanced by adding sufficient additive elements in the bonding wire, leaning failures occur in some cases, and this is considered as a problem. This tendency is observed through all conventional 4N gold bonding wires, and nowadays, it particularly becomes a significant problem for thinning of a bonding wire.

When the BGA substrate is used because of the needs for high densification of semiconductor device to be mounted, miniaturization, thinning and the like, because the BGA substrate is relatively weak against heat, a low bonding temperature must be required. In this case, a bonding part does not easily spread well because of the low temperature bonding, so that a failure that the 2nd bonding strength decreases occurs, and this is considered as a problem.

As explained above, in accordance with the nowadays technological trend, such as the high densification of a semiconductor device to be mounted, failures, such as leaning and a weak 2nd bonding strength, become distinct.

It is an object of the present invention to provide a semiconductor mounting bonding wire which overcomes the problems of the foregoing conventional technologies, and which suppresses any failures, such as a leaning failure and the lack of the 2nd bonding strength, in the application of the high densification of a semiconductor device to be mounted.

Means for Solving the Problem

The inventors of the present invention keenly studied, and found out as a result that the adhesiveness of a bonding wire to a bonding target closely relates to the 2nd bonding strength, in addition to the deformability of the bonding wire, and by causing the bonding wire to be easily deform, i.e., by increasing the breaking elongation, the area of the 2nd bonding part is increased and the adhesiveness of the bonding wire to a bonding target is improved, thereby enhancing the 2nd bonding strength. However, as explained above, when the breaking elongation becomes large, the tensile strength becomes insufficient, resulting in occurrence of a leaning failure, the inventors of the present invention found out the following.

The yield strength of a bonding wire closely relates to the leaning failure, not the tensile strength of the bonding wire which has been considered conventionally, and when the yield strength is too small relative to the tensile strength even if the tensile strength is large, a plastic deformation occurs under relatively small stress, and the leaning failure occurs. In contrast, the inventors of the present invention found out that when the yield strength is as large as the tensile strength, no plastic deformation occurs even if relative large stress is applied, so that the bonding wire does not deform permanently, and the bonding wire having a large breaking elongation can suppress any leaning failure.

The inventors of the present invention further keenly studied, and the present invention is based on what they found out, and employs the following structures.

A semiconductor mounting bonding wire of the present invention set forth in claim 1 has a breaking elongation of 7 to 20%, and wherein stress at 1% elongation is within a range from 90% of a tensile strength to 100% thereof.

The semiconductor mounting bonding wire of the present invention set forth in claim 2 is according to claim 1, and contains Ag of 10 to 90 mass %, and wherein a balance contains Au, an inevitable impurity of Au, and an inevitable impurity of Ag.

The semiconductor mounting bonding wire of the present invention set forth in claim 3 is according to claim 1, and contains Ag of 55 to 75 mass %, and wherein a balance contains Au, an inevitable impurity of Au, and an inevitable impurity of Ag.

The semiconductor mounting bonding wire of the present invention set forth in claim 4 is according to claim 1, and contains Ag of 15 to 45 mass %, and wherein a balance contains Au, an inevitable impurity of Au, and an inevitable impurity of Ag.

The semiconductor mounting bonding wire of the present invention set forth in claim 5 is according to any one of claims 2 to 4, and wherein a total amount of one or greater than or equal to two kinds of elements selected from Cu, Pr, Ti and V is 2 to 10000 mass ppm.

The semiconductor mounting bonding wire of the present invention set forth in claim 6 is according to claim 5, and wherein a total amount of one or greater than or equal to two kinds of elements selected from Al, Co, Fe, Ge, Mn, Ca, Be, In, Hf, Pd, La and Pt is 2 to 100000 mass ppm.

A semiconductor device of the present invention set forth in claim 7 comprises a semiconductor mounting bonding wire according to any one of claims 1 to 6, and wherein the semiconductor mounting bonding wire is connected to a wiring electrode formed of Al or an Al alloy.

A semiconductor device of the present invention set forth in claim 8 comprises a semiconductor mounting bonding wire according to any one of claims 1 to 6, wherein the semiconductor mounting bonding wire connects a wiring electrode on a semiconductor substrate with a Ag plating surface or a Pd plating surface on a lead.

Effect of the Invention

According to the bonding wire of the present invention, the bonding strength at a 2nd bonding part and the sufficient strength of the bonding wire are simultaneously achieved, so that occurrence of a leaning failure and a failure like the lack of the 2nd bonding strength can be dramatically reduced. Further, in the application of the high densification of a semiconductor device to be mounted, the foregoing effect becomes remarkable.

BEST MODE FOR CARRYING OUT THE INVENTION

The inventors of the present invention found out that if the breaking elongation is 7 to 20%, the 2nd bonding strength becomes superior, and a good 2nd bonding characteristic can be achieved even through a low temperature bonding. This effect results from a situation where a 2nd bonding is accomplished by greatly processing a bonding wire. In general, at a 2nd bonding part, a bonding wire which is originally in a linear shape is greatly deformed into a crescent-moon-like shape. A bonding wire having a 4-% elongation is able to deform by a deformation degree corresponding to such 4%, and if a deformation beyond that deformation degree is attempted, a material breaks out. On the other hand, if the breaking elongation is 7 to 20%, a deformation corresponding to such 7 to 20% becomes possible. Accordingly, it is thought that, at the breaking elongation of about 4%, an ability of deforming a bonding wire into a wedge shape is insufficient in some cases, and the adhesiveness between the bonding wire and a bonding target becomes insufficient in case of a severe bonding like a low temperature bonding. As a specific example, in a case where the breaking elongation is about 2% as disclosed in the patent literature 1, the leaning failure becomes less notable since the Young's modulus and the rigidity are high, but a high adhesiveness through a low temperature bonding cannot be achieved. However, if the breaking elongation of a bonding wire is set to 7 to 20% like the present invention, the deformability of a bonding wire is improved, so that a sufficient adhesiveness between the bonding wire and a bonding target can be ensured in deforming the bonding wire greatly, and it is thought that a good 2nd bonding strength can be achieved even through a low temperature bonding. Preferably, if the breaking elongation of a bonding wire is 9 to 20%, the adhesiveness of a 2nd bonding part is further improved, and the dispersion in the 2nd bonding strengths becomes small. On the other hand, if the breaking elongation is less than 7%, the area of a 2nd bonding part becomes unstable in performing low temperature bonding, and the dispersion in the 2nd bonding strengths may become large. Further, if the breaking elongation becomes over 20%, the tensile strength of a bonding wire decreases so that wire sweeping becomes excessive, and it is not preferable.

Conventionally, it has been thought that if the breaking elongation is large, the tensile strength becomes insufficient, resulting in a leaning failure, but it becomes clear from the study of the inventors that the yield strength of a bonding wire (i.e., stress at an area having a small elongation) closely relates to the leaning failure, not the tensile strength of the bonding wire which has been considered conventionally. That is, if the yield strength is too small relative to the tensile strength, a plastic deformation occurs under relatively small stress, and thus a leaning failure occurs (this tendency particularly becomes notable in a bonding wire having a large breaking elongation). On the other hand, if the yield strength is as high as the tensile strength, no plastic deformation occurs even if relatively large stress is applied, so that a bonding wire does not perform permanent deformation, thereby suppressing any leaning failures. Based on such technological idea, the inventors of the present invention further studied and found out that it is possible to suppress any leaning failures if stress at 1% elongation is greater than or equal to 90% of a tensile strength and less than or equal to 100% thereof (maximum stress until a bonding wire breaks down). That is, if stress at 1% elongation is greater than or equal to 90% of the tensile strength, no plastic deformation occurs even if relatively large stress is applied, so that the effect of suppressing any leaning failures becomes remarkable under a condition where a bonding wire is normally used. On the other hand, if stress at 1% elongation is lower than 90% of the tensile strength, because the yield strength is small even though the tensile strength is large, and a plastic deformation occurs under relatively small stress, thereby causing a leaning failure. For example, in the case of conventional 4N—Au bonding wires and Au alloy bonding wires, the tensile strength of the bonding wire can be fully enhanced by sufficiently adding additive elements in the bonding wire, but because stress at 1% elongation remains at about 70% of the tensile strength, a leaning failure occurs. On the other hand, it is impossible in principle that stress at 1% elongation becomes larger than the tensile strength, so that the maximum value of the stress at 1% elongation is 100% of the tensile strength. That is, in 1% elongation range, it is in an elastic deformation range or the maximum value (yield point) of the elastic deformation, the tensile strength becomes large, no elastic deformation nor ductibility occur, and stress at 1% elongation is less than or equal to the tensile strength even if a bonding wire breaks down at an elastic deformation range. When a bonding wire breaks down at 1% elongation, stress at 1% elongation and the tensile stress become equal, and the stress at 1% elongation becomes 100% of the tensile stress.

FIG. 1 schematically shows an example of the tensile curve of the bonding wire according to the present invention (represented by "A" in the FIGURE), and an example of the tensile curve of a 4N—Au bonding wire or a Au alloy bonding wire (represented by "B" in the FIGURE). As shown in FIG. 1, according to the tensile curve A of the bonding wire of the present invention, stress at 1% elongation is greater than or equal to 90% of the tensile strength, so that the curve represents the characteristic of the bonding wire of the present invention. In contrast, according to the tensile curve B of a 4N—Au bonding wire or a Au alloy bonding wire, as shown in FIG. 1, stress at 1% elongation is about 70% of the tensile stress and is small even though the tensile strength is the same as that of the bonding wire of the present invention.

Like the bonding wire of the present invention, if stress at 1% elongation is greater than or equal to 90% of the tensile strength, an area from 1% elongation to 7 to 10% breaking elongation can be approximated by a roughly straight line, and it is normal that stress at the time of break down is the maximum stress, i.e., tensile strength. Here, let us suppose that a bonding wire has stress at 1% elongation within the range from greater than or equal to 90% of the tensile strength to less than or equal to 100% thereof, the tensile strength of the bonding wire is σM [MPa], and the breaking elongation of the bonding wire is EL [%], then, if a slope S between arbitrary two points in an area from 1% elongation to a breaking elongation in the tensile curve is within a range 0 (horizontal) $\leq S \leq (0.1 \times \sigma M)/(EL-1)$, the foregoing effect can be stably obtained which is further preferable. It is most preferable that if a bonding wire has stress at 1% elongation within a range from greater than or equal to 90% of the tensile strength and to less than or equal to 100% thereof and a 0.2% proof stress (stress when a 0.2% distortion is applied to a test sample piece, and causes a certain plastic deformation) in the tensile curve greater than or equal to 80% of the tensile strength and less than or equal to 100% thereof, an effect that the linearity of a loop is improved can be achieved in addition to the foregoing effect. For example, in a case where bonding having a long span of greater than or equal to 5 mm is carried out, there is a good effect that loop control can be carried out stably. In general, various kinds of stresses are applied to loops, and if a vertical component of such stresses is applied to one of the loops, the loop plastically deforms, thereby deteriorating the linearity of the loop. In order to avoid this phenomenon, the yield point should be located beyond the vertical component. That is, it is thought that the effect of improving the linearity of a loop is achieved by the yield stress of the bonding wire which is larger than those of the conventional bonding wires.

As explained above, if the breaking elongation of a bonding wire is 7 to 20% and the stress of the bonding wire at 1% elongation is within a range from greater than or equal to 90% of the tensile strength and to less than or equal to 100% thereof, a leaning failure and a wire sweep failure can be suppressed, and a high 2nd bonding strength can be achieved even through a low temperature bonding.

In addition to the foregoing effects, according to the bonding wire of the present invention, an effect of suppressing any spring failures can be further achieved. Even in case of, for example, so-called reverse bonding which becomes popular nowadays and in which ball bonding is performed on a 2nd bonding electrode and wedge bonding is performed on a 1st bonding electrode to control the height of a loop and so as to make a chip thin, a spring failure can be suppressed.

According to such reverse bonding, first, ball bonding is performed on a 1st bonding electrode, a bonding wire right above a bonded ball is cut, ball bonding is performed on a 2nd bonding electrode, and then wedge bonding is performed on the formed ball on the 1st bonding electrode. A spring failure is a phenomenon that a bonding wire plastically deforms in a spring-like shape as large impact is applied to the bonding wire when the bonding wire right above a ball is cut after ball bonding is performed on a 1st bonding electrode. The inventors of the present invention keenly studied and found out that a bonding wire must simultaneously have a high tensile strength which suppresses any plastic deformation when impact is applied, and a high ductility (i.e., large breaking elongation) for absorbing the impact to suppress any spring failures. That is, if the breaking elongation of a bonding wire is 7 to 20%, a high 2nd bonding strength can be achieved, and if stress at 1% elongation is within a range from greater than or equal to 90% of the tensile strength and to less than or equal to 100% thereof, the effect of suppressing both leaning failure and wire sweep failure can be achieved. However, if the breaking elongation of a bonding wire is 7 to 20% and stress at 1% elongation is set within a range from greater than or equal to 90% of the tensile strength and to less than or equal to 100% thereof, the effect of suppressing any spring failures can be achieved in addition to the foregoing effects.

It is difficult to manufacture the bonding wire of the present invention through a normal manufacturing method, so that a special manufacturing method is required. For example, by repeating rapid cooling and heating of an ingot greater than or equal to three times in casting, the composition of a material can be refined. In general, it is well known that a refined composition indicates a high ductility in addition to a high strength. Preferably, it is effective to increase the reduction of area of each dice used in wire drawing to greater than or equal to 15%. This is because a large deformation is performed on a bonding wire every time the bonding wire passes through a dice with a high reduction of area, and the composition of the bonding wire is further refined. On the other hand, processing of a bonding wire may be unpractical according to such a manufacturing method, and a bonding wire is broken in the worst case. In order to avoid this, although industrial mass production of bonding wires is not preferable, it is important to make the wire drawing rate as slow as possible, like 2 to 5 m/min.

The composition of the bonding wire of the present invention is not limited to any particular one, but the inventors of the present invention keenly studied and found out that if a bonding wire contains 10 to 90 mass % of Ag and the balance is comprised of Au and inevitable impurities thereof, it is possible to stably set the breaking elongation of the bonding wire to be 7 to 20% and to stably set stress at 1% elongation to be within a range from greater than or equal to 90% of the tensile strength and to less than or equal to 100% thereof at a fast wire drawing rate. That is, in considering industrially stable manufacturing of the products, the foregoing element base is desirable. It is expected that in a Au—Ag bonding wire having the foregoing composition, the texture in which <111> direction indicated by Au and a line direction is parallel to each other and the texture in which <100> direction indicated by Ag and a line direction is parallel to each other act synergically, the Au texture provides a high strength, and the Ag texture indicates a high ductility.

In contrast, in a case where the contained amount of Ag is less than 10 mass %, or in the case of conventional 4N—Au or Au alloy bonding wire, only the Au texture develops or becomes superior, so that it is difficult to increase an elongation even though the strength can be enhanced. For example, in a case where the breaking elongation is set to be greater than or equal to 7%, a strength within a range from 1% elongation to a breaking elongation in a tensile curve often becomes less than 90% of the tensile strength as far as the foregoing manufacturing method is adopted.

On the other hand, if the contained amount of Ag exceeds 90 mass %, the main element of a bonding wire becomes AG, so that the surface of the bonding wire is likely to be sulfurized or oxidized, resulting in an insufficient 2nd bonding strength. This is not preferable in some cases.

Therefore, if the breaking elongation of a bonding wire is set to be in a range of 7 to 20%, Ag of 10 to 90 mass % is contained in the bonding wire, and the balance is comprised of Au and the inevitable impurities thereof, a 2nd bonding strength is sufficiently ensured, no wire sweep failure occurs when a resin is filled, and the foregoing problems can be solved. In addition, the surface of the bonding wire is not likely to be sulfurized or oxidized.

To manufacture the bonding wire having the foregoing composition, first, highly-pure Au and highly-pure Ag are subjected to weighing as starting materials, those materials are heated and dissolved under a high vacuum atmosphere or an inert atmosphere like nitrogen or Ar, an ingot is obtained, and then the ingot is subjected to wire drawing to have a line diameter of a final core material using metal dices. According to this method, manufacturing of a bonding wire and quality management are easy.

However, when the Au—Ag bonding wire having the foregoing composition based on the present invention is subjected to wire drawing, unlike the conventional bonding wires comprised of only highly-pure Au, the compositions of Au and Ag in the line direction of the bonding wire is likely to vary and the distribution thereof becomes ununiform. Therefore, when the bonding wire is subjected to wire drawing, it is necessary to employ a scheme different from conventional ones. For example, in a case of wire drawing for a line diameter of greater than or equal to 100 μm, wire drawing must be carried out with the reduction of area of a dice being set to 10 to 18%, and in a case of wire drawing for a line diameter of less than 100 μm, the reduction of area must be set to about 6 to 14%. This is based on an idea that the composition of a material can be refined with a large reduction of area as much as possible since breaking of a bonding wire is not likely occur when the line diameter is greater than or equal to 100 μm, and the reduction of area should be set to be smaller than the line diameter of less than 100 μm since the possibility of breakage of a bonding wire increases when the line diameter is less than 100 μm. More preferably, the interior of a melting furnace should be stirred during a melting process since the composition dispersion due to wire drawing can be easily controlled when a Au—Ag alloy which is uniform as much as possible is obtained.

Examples of stirring schemes are: a scheme of providing a fan which is made of a high-melting point metal like tungsten in a melting furnace, connecting the fan with a motor provided outside the furnace to rotate the fan; and a scheme of inserting a so-called sitirrer having a magnetic property into a furnace, and applying a periodical magnetic field from the exterior of the furnace. In a case where the weight of a material in the melting furnace is heavy, such as greater than or equal to 50 kg, the foregoing stirring scheme is insufficient, and, available in this case is a scheme of blowing out an inert gas like argon or nitrogen from the bottom of a melted material to apply a convection to the material, thereby stirring the material. However, if the inert gas contains oxygen of greater than or equal to 1000 ppm, the material is oxidized, so that it is important to manage the purity of the inert gas.

After the wire drawing process, a process of heating a bonding wire is required. In this process, a method of setting the temperature inside an electrical furnace to be uniform, and sweeping bonding wires successively through the electrical furnace at a constant rate can be employed. Here, Au—Ag bonding wires are likely to be sulfurized or oxidized since it contains Ag as a main element, it is necessary to prevent the bonding wire from being sulfurized or oxidized by causing the interior of the furnace to be an inert gas atmosphere like nitrogen or Ar. In order to do so, unlike the conventional bonding wires comprised of only highly-pure Au, it is necessary to set the oxygen concentration and the sulfur concentration in the inert gas atmosphere to less than or equal to 1000 ppm. More preferably, if a reducing gas of at least 1000 ppm like hydrogen is mixed in the inert gas, the effect of suppressing sulfidization and oxidization of the bonding wire is enhanced. Most preferably, introduction of oxygen and impurity gas like sulfur from the exterior of the furnace may be avoided as much as possible, and another layer of a second atmosphere furnace may be provided outside the atmosphere furnace, even if a little amount of impurity gas is mixed in the second atmosphere, the reducing gas in the second atmosphere disacidifies the impurity gas, so that the impurity gas cannot reach the first atmosphere furnace. Further, an appropriate temperature inside the furnace varies depending on the composition of the bonding wire and the rate of sweeping the bonding wire, but if it is set to be in a range from 200° C. to 700° C., a bonding wire having a stable quality can be obtained. At this time, if the temperature varies inside the furnace, the composition of the bonding wire in the line direction is likely to vary, so that it is important to maintain the temperature inside the furnace within a range ±5° C. from the target temperature more precisely than the case of the conventional bonding wires comprised of only high-pure Au when manufacturing the bonding wire of the present invention. More preferably, if heat insulating materials are provided on both ends of the furnace, heat does not come out from both ends of the furnace, so that the temperature inside the furnace becomes stable.

The inventors of the present invention further keenly studied and found out that the electrical resistivity of a bonding wire decreases if the contained amount of Ag is 55 to 90 mass %, so that the bonding wire can be used for devices which requires a fast responsiveness. If the contained amount of Ag is within this range, the amount of Au can be significantly reduced, so that the material cost which becomes higher and higher nowadays can be reduced. If the concentration of Ag is 10 to 75 mass %, the oxidation resistance and sulfidization resistance of a bonding wire are further improved, so that the surface of the bonding wire is not likely to be sulfurized or oxidized when the bonding wire is stored in an atmosphere for a several months or the bonding wire is stored at a high temperature, for example. Therefore, if the contained amount of Ag is 55 to 75 mass %, it is very good that the electrical resistivity of the bonding wire is reduced, the material cost of Au is suppressed, and the oxidation resistance and sulfidization resistance of the bonding wire are further improved.

The inventors of the present invention further keenly studied and found out that if the contained amount of Ag is 15 to 45 mass %, the long-term reliability of a 1st bonding part improves. This is because occurrence of a void is suppressed as occurrence and deposition of a vacancy caused by the interaction of Au, Ag, and Al (constituent elements of an electrode) at the bonding interface of a 1st bonding part is suppressed. More preferably, if the contained amount of Ag is over 20 mass % but is less than or equal to 40 mass %, occurrence of a void is further suppressed, so that the long-term reliability of a 1st bonding part further improves. In this case, even for a 1st bonding electrode that is comprised of Al—Cu, which becomes nowadays popular, the interaction of Au, Ag, and Al can be ensured, and a good long-term reliability is achieved.

Furthermore, when a bonding wire contains one or greater than or equal to two kinds of Cu, Pr, Ti and V at a total amount of 2 to 10000 mass ppm, the composition of an initial ball is refined, so that the circularity of a 1st bonding part improves. As a result, for example, when the pitch between electrodes (pad pitch) is set to be narrowed (narrowed electrode pitch) like less than or equal to 70 μm, a shorting of adjoining bonding parts can be avoided. In this case, for example, in a stacked-structure semiconductor device in which a plurality of semiconductor chips are stacked over one another and bonded bonding wires are arranged intricately, and which severely requires suppression of any shorting, a shorting can be avoided. When the composition of the foregoing elements is less than 2 mass ppm, the foregoing effect may not be sufficiently obtained. Moreover, if the composition of the foregoing elements exceeds 10000 mass ppm, the added element segregates on the surface of a bonding wire, and it is not preferable since the possibility that the surface of the bonding wire is sulfurized or oxidized increases.

Further, if a bonding wire further contains one or greater than or equal to two kinds of Al, Co, Fe, Ge, Mn, Ca, Be, In, Hf, Pd, La and Pt at a total amount of 2 to 100000 mass ppm, the composition of an initial ball is further refined, thereby increasing the bonding strength of a 1st bonding part. As a result, for example, even if an initial ball is miniaturized as to have a diameter of less than or equal to 50 μm, a bonding strength necessary for a good bonding can be ensured. In this case, it is advantageous particularly for ensuring a bonding strength in narrow pitch bonding which becomes nowadays popular. However, if the composition of the foregoing elements is less than 2 mass ppm, the foregoing effect may not be sufficiently obtained. Moreover, when the composition of the foregoing elements exceeds 100000 mass ppm, the added element segregates on the surface of a bonding wire, and it is not preferable since the possibility that the surface of the bonding wire is sulfurized or oxidized increases.

Examples of a scheme of analyzing the contained amount of a constituent of a bonding wire are: a scheme of carrying out analysis while digging down in a depth direction from the surface of the bonding wire by sputtering; and a scheme of line analysis or point analysis at a cross section of the bonding wire. According to the former digging scheme, it takes too much measurement time when a bonding wire is thick. According to the latter cross-section analysis, it is advantageous that checking of a concentration distribution across the entire cross-section and the reproducibility at several points are relatively easy. A line analysis is relatively easy for the cross-section of a bonding wire, but in a case where improvement of an analysis is desired, narrowing the analysis pitch in a line analysis or carrying out a point analysis while enlarging an area where analysis is particularly desired is effective. Examples of an analysis device used for such analysis are an EPMA (Electron Probe Micro Analysis), an EDX (Energy Dispersive X-ray analysis), an AES (Auger Electron Spectroscopy), a TEM (Transmission Electron Microscope), and the like. In regard to research of an average composition, it is possible to adopt a scheme of melting a bonding wire step by step from the surface thereof with a chemical like an acid, and determining the composition of a melted part based on the concentration in a solution.

The bonding wire of the present invention is suitably used to be connected with a wiring electrode comprised of Al or an Al alloy, and can cause a semiconductor device to have a high reliability. Moreover, the semiconductor mounting bonding wire of the present invention is suitably used for connecting a wiring electrode on a semiconductor substrate with a silver plating surface or a Pd plating surface on a lead frame, and can cause a semiconductor device to have a high reliability. Further, the semiconductor mounting bonding wire of the present invention is suitably used for connecting a wiring electrode comprised of Al or mainly comprised of Al alloy on a silicon chip provided on the semiconductor lead frame or a BGA substrate with a silver plating surface or a Pd plating surface on the lead of the lead frame, or a land of the BGA substrate comprised of gold or copper, and can cause a semiconductor device to have a high reliability.

EXAMPLES

Hereinafter, an explanation will be given of the examples of the present invention.

Highly-pure Au having a purity of greater than or equal to 99.99 mass % and individual additive elements were prepared as the raw materials of a bonding wire. The composition was adjusted beforehand, the materials were fused in an Ar atmosphere, and then casting was carried out to obtain a Au alloy ingot having a diameter of about 10 mm. Thereafter, forging, metal rolling, and wire drawing were carried out to form a predetermined thin line having a diameter of 25 μm, and the thin line was subjected to a heating process in an electrical furnace under an Ar atmosphere where the temperature was maintained to 380 to 420° C., thereby obtaining a Au bonding wire. When the ingot was casted, water cooling (rapid cooling) and heating were repeated three times. The reduction of area of each dice used in wire drawing was set to greater than or equal to 18%, which was large. In order to avoid breakage of a bonding wire, the wire drawing rate was set to 2 m/min (indicated by a circle mark in the field of "wire manufacturing method" in table 1). As a comparative example, a bonding wire was manufactured through a normal manufacturing method. In this case, no rapid cooling nor heating were repeated in casting the ingot, the reduction of area of a dice was set to 8%, which is normal, and the wire drawing rate was set to 25 m/min, which is normal (indicated by a cross mark in the field of "wire manufacturing method" in table 1). Various data on Au bonding wires manufactured in this fashion are summarized and shown in table 1.

In addition to the foregoing Au bonding wires, Au—Ag bonding wires were also manufactured. As the raw materials thereof, highly-pure Au and Ag whose purity was 99.99 mass %, and additive elements were prepared. The composition was originally adjusted, the materials were fused in an Ar atmosphere, and then casting was carried out, thereby obtaining a Au—Ag ingot having a diameter of about 10 mm. Thereafter, forging, metal rolling and wire drawing were carried out to form a predetermined thin line having a diameter of 25 μm, and the thin line was subjected to a heating process in an electrical furnace under an Ar atmosphere (oxygen concentration: about 100 ppm) where the temperature was maintained to 398 to 402° C., thereby obtaining a Au—Ag bonding wire. The sweeping rate of the bonding wire was set to 25 m/min at the time of wire drawing and the heat process, the reduction of area of a dice in wire drawing was about 14% for a line diameter greater than or equal to 100 μm, and about 8% for a line diameter less than 100 μm. Various data on the Au—Ag bonding wires manufactured in this fashion is summarized and shown in tables 2 to 6 as examples.

When the foregoing bonding wires were manufactured, a trouble like breaking of a wire partially occurred at the manufacturing step. Accordingly, as a barometer representing a manufacturing yield, the number of breaking occurred while carrying out wire drawing of 100 m (manufacturing yield=100×(the number of breaking bonding wires/the number of bonding wires created by wire drawing)) is shown in the field of "manufacturing yield/%" in tables 1 to 6.

The contained amount of an element constituting an obtained bonding wire was acquired by dissolving the bonding wire step by step from the surface thereof with an acid, and obtaining the composition of the dissolved part from the concentration in the solution. Compositions other than inevitable impurities among the acquired values are shown in the field of "tiny amount additive element/mass ppm" in tables 1 to 6.

The surface of a bonding wire was observed through an optical microscope and an SEM (scanning Electron Microscope), and a cross mark is put on the field of "wire surface sulfidization/oxidization" in tables 2 to 6, when sulfidization or oxidization was observed, and a circle mark is put on that field when no sulfidization or oxidization was observed. Further, to acceleratingly evaluate the oxidization resistance of a bonding wire and the sulfidization resistance thereof, a bonding wire were left in a electronic furnace maintained at 150° C. (atmosphere thereinside was room air) for 24 hours, the surface of the bonding wire was observed through an optical microscope and an SEM, and when no sulfidization nor oxidization was observed, a double circle mark is put on the field of "wire surface sulfidization/oxidization" in tables 2 to 6.

The mechanical characteristic of a bonding wire was measured using a commercially-available tensile tester. A resultant breaking elongation of a bonding wire is shown in tables 1 to 6. Here, the relationship between the elongation of a bonding wire and stress is recorded as a tensile curve diagram, and stress at 1% elongation and a tensile strength were read out from the diagram, and a rate of the stress at 1% elongation with respect to the tensile strength is shown in tables 1 to 6.

Provided that the tensile strength of a bonding wire is σM [MPa] and the breaking elongation of the bonding wire is EL [%], then, when a slope S between two arbitrary points from 1% elongation to a breaking elongation in the tensile curve always satisfies $0(\text{horizontal}) \leq S \leq (0.1 \times \sigma M)/(EL-1)$, a circle mark is put on the field of "slope between arbitrary two points from 1% elongation to breaking elongation" in tables 1 to 6, and when it does not always satisfy the foregoing condition, a cross mark is put on that field.

As the yield strength of a bonding wire, 0.2% proof stress was estimated from the foregoing diagram, when the rate of 0.2% proof stress with respect to the tensile strength was greater than or equal to 80% and less than or equal to 100%, a circle mark is put on the filed of "ratio of 0.2% proof stress with respect to tensile strength" in tables 1 to 6, and when it was below 80%, a cross mark is put on that field.

To connect a bonding wire, a commercially-available wire bonder was used. The targets to be connected with a bonding wire were an Al electrode formed on an Si chip and having a thickness of 1 μm, and a lead of a lead frame having a Ag plating on the surface thereof. Right before carrying out bonding, an initial ball having a diameter of 46 μm is formed at the leading end of a bonding wire by arc discharge. The formed initial ball was subjected to ball bonding with the foregoing electrode heated to 250° C. (150° C. in the case of low temperature bonding), and the base part of the bonding wire was subjected to wedge bonding with the foregoing lead heated to 250° C. (150° C. in the case of low temperature bonding), and an initial ball was formed again, thereby repeating bonding successively. The bonding was carried out in such a way that a loop length become 5 mm. A temperature at the time of bonding is shown in tables 1 to 6.

A 2nd bonding strength of a wedge bonded part was measured using a commercially-available peel tester. 200 wires were subjected to the peel test for each condition, when the average value of the bonding strength at that time was greater than or equal to 100 mN, it is assumed that an excellent 2nd bonding strength was obtained, and a double circle mark is put on the field of "2nd bonding strength" in tables 1 to 6, when the average value was greater than or equal to 80 mN and was less than 100 mN, it is assumed that a good 2nd bonding strength was obtained, and a circle mark is put on that field, when the average value was greater than or equal to 60 mN and was less than 80 mN, it is assumed that practically sufficient 2nd bonding strength was obtained, and a triangle mark is put on that field, and when the average value was less than 60 mN, it is assumed that the 2nd bonding strength was insufficient, and a cross mark is put on that field.

The dispersion of the 2nd bonding strength was also calculated, and when the difference between the maximum value and the minimum value was less than 10 mN, it is assumed that dispersion is significantly suppressed, and a double circle mark is put on the field of "dispersion in 2nd bonding strength" in tables 1 to 6, when the difference was greater than or equal to 10 mN and was less than 20 mN, it is assumed that dispersion was suppressed, and a circle mark is put on that field, and when the difference was greater than or equal to 20 mN and was less than 40 mN, it is assumed as a practically sufficient level, and a triangle mark is put on that field, and when the difference was greater than or equal to 40 mN, it is ensured that suppression of any dispersion was insufficient, and a cross mark is put on that field.

To measure the level of a leaning failure of a bonding wire, in the foregoing bonded samples, the displacement of a loop relative to a vertical line to a bonding surface at a 1st bonding part, i.e., the leaning degree was observed through an optical microscope for 500 wires for each sample, and when the average of the leaning degree was greater than or equal to 30 μm, it is assumed as a failure, and a cross mark is put on the field of "suppression of leaning failure" in tables 1 to 6, when the average was greater than or equal to 20 μm and was less than 30 μm, it is assumed that there is no practical problem, and a circle mark is put on that field, and when the average was less than 20 μm, it is significantly good, and a double circle mark is put on that field.

To measure the level of the linearity of a loop, 50 wires were observed from a Z direction through an optical microscope for each of the foregoing bonded samples, and a maximum separated distance defined by a straight line which connects a 1st bonding point and a 2nd bonding point and the loop was measured. When the average of the separated distance is greater than or equal to 30 μm, it is assumed as a failure, and a cross mark is put on the filed of "loop linearity" in table 1, when the average was greater than or equal to 20 μm and was less than 30 μm, it is assumed that there is no practical problem, and a circle mark is put on that field, and when the average was less than 20 μm, it is excellent, and a double circle mark is put on that field.

To measure the level of a spring failure of a bonding wire, 500 wires were observed through an optical microscope for each of the foregoing bonded samples, when there was even a single loop having any spring-like bend, i.e., a spring failure, it is assumed as a failure, and a cross mark is put on the filed of "presence/absence of spring failure" in tables 1 to 6, when there was no loop having a spring failure, it is assumed as no problem, and a circle mark is put on that field.

In regard to 1st bonding strength between an initial ball and an electrode, breaking load (shear strength) of 40 wires were measured through a so-called shear strength measuring method in which a jig is moved in parallel with an electrode surface 2 μm above the electrode to measure a shear fracture strength of a 1st bonding part. When the average of shear strengths was greater than or equal to 250 mN, it is assumed that an excellent 1st bonding strength was ensured, and a double circle mark is put on the field of "1st bonding strength" in tables 2 to 6, when the average was greater than or equal to 200 mN and was less than 250 mN, it is assumed that a practically sufficient 1st bonding strength was ensured, and a circle mark is put on that field, and when the average was less than 200 mN, it is assumed that the 1st bonding strength was insufficient, and a cross mark is put on that field.

To measure the electric resistivity of a bonding wire, the foregoing manufactured bonding wires were cut to the size of 10 cm, and the degree of potential drop was measured through a four-terminal method. As a result, when the measured electric resistivity was less than or equal to 9 μΩ·cm, it is assumed that an excellent electric resistivity was ensured and a double circle mark is put on the field of "electric resistivity" in tables 2 and 3, when the electric resistivity was over 9 μΩ·cm but was less than or equal to 12 μΩ·cm, it is assumed that a good electric resistivity was ensured, and a circle mark is put on that field, and when the electric resistivity was over 12 μΩ·cm, it is assumed that the electric resistivity was insufficient, and a cross mark is put on that field.

To measure a long-term reliability at a bonded part of an initial ball and an electrode, the foregoing test samples were left in an electric furnace at 175° C. for 1000 hours, and then a shear strength at a bonded part of individual 40 wires were measured through the foregoing shear strength measuring method. When the average of the shear strengths was greater than or equal to 300 mN, it is assumed that an excellent reliability was ensured and a double circle mark is put on the field of "1st bonding part reliability" in tables 2 to 6, when the average was greater than or equal to 250 mN and was less than 300 mN, it is assumed that a good reliability was ensured and a circle mark is put on that field, and when the average was greater than or equal to 200 mN and was less than 250 mN, it is assumed that a practically sufficient reliability was ensured and a circle mark is put on that field, and when the average was less than 200 mN, it is assumed that a reliability was insufficient, and a cross mark is put on that field.

Further, to measure the circularity of a 1st bonding part, the shape thereof was evaluated using an optical microscope. At this time, when a difference between a value in the X direction and a value in the Y direction was less than 2 μm, it is assumed that a dispersion was significantly suppressed and a double circle mark is put on the field of "1st bonding part circularity" in tables 2 to 6, when the difference was greater than or equal to 2 μm and was less than 4 μm, it is assumed that the practically sufficient level of a circularity was ensured and a triangle mark is put on that field, and when the difference was greater than or equal to 4 μm, it is assumed that the dispersion was not sufficiently suppressed and a cross mark is put on that field.

The bonding wire according to claim 1 corresponds to examples 1 to 138, the bonding wire according to claim 2 corresponds to examples 5 to 84, the bonding wire according to claim 3 corresponds to example 45 to 59, the bonding wire according to claim 4 corresponds to examples 60 to 84, the bonding wire according to claim 5 corresponds to examples 85 to 101, and the bonding wire according to claim 6 corresponds to examples 102 to 138. In regard to the respective representative examples set forth in the claims, the evaluation results will be partially explained.

According to the examples 1 to 4 of the bonding wire of the present invention, because the breaking elongation of the boding wire and the range of the ratio of stress at 1% elongation with respect to the tensile strength were appropriate, a sufficient 2nd bonding strength was ensured, a leaning failure was suppressed, and a spring failure was also suppressed. In particular, according to the examples 3 and 4 of the bonding wire, because the ratio of the 0.2% proof stress with respect to the tensile strength was in an appropriate range, the linearity of a loop was excellent. The example 4 contained 10% Ag, so that the manufacturing yield improved. In contrast, according to the bonding wires of comparative examples 1 to 4, because the breaking elongation of a bonding wire and the ratio of stress at 1% elongation with respect to the tensile strength were small, a leaning failure and a spring failure occurred. The comparative examples 3 and 4 contained Ag, but made by the conventional manufacturing method, so that the manufacturing yield did not improved. According to the comparative example 4, because the breaking elongation was 21% which was high, the linearity of a loop was poor.

TABLE 1

| SAMPLE NO. | BONDING TEMPERATURE/ °C. | MAIN CONSTITUENT ELEMENT/ MASS % | TINY AMOUNT ADDITIVE ELEMENT/ MASS PPM | WIRE MANUFACTURING METHOD | WIRE YIELD/ % | RATIO OF STRESS AT 1% ELONGATION TO TENSILE STRENGTH | SLOPE BETWEEN ARBITRARY TWO POINTS FROM 1% ELONGATION AND BREAKING ELONGATION |
|---|---|---|---|---|---|---|---|
| EXAMPLE 1 | 250 | 4N—Au | Ca: 1, Be: 1 | ○ | 94 | 90 | ○ |
| EXAMPLE 2 | 250 | 2N—Au | Pd: 9000 | ○ | 79 | 90 | ○ |
| EXAMPLE 3 | 250 | Au—9% Ag | Ca: 1, Be: 1 | ○ | 81 | 98 | ○ |
| EXAMPLE 4 | 250 | Au—10% Ag | Ca: 1, Be: 1 | ○ | 79 | 98 | ○ |
| COMPARATIVE EXAMPLE 1 | 250 | 4N—Au | Ca: 1, Be: 1 | X | 89 | 75 | X |
| COMPARATIVE EXAMPLE 2 | 250 | 3N—Au | Ca: 1, Be: 1 | X | 78 | 77 | X |
| COMPARATIVE EXAMPLE 3 | 250 | Au—9% Ag | Ca: 1, Be: 1 | X | 61 | 87 | X |
| COMPARATIVE EXAMPLE 4 | 250 | Au—10% Ag | Ca: 1, Be: 1 | X | 57 | 89 | X |

| SAMPLE NO. | RATIO OF 0.2% PROOF STRESS TO TENSILE STRENGTH | WIRE BREAKING ELONGATION/% | 2ND BONDING STRENGTH | DISPERSION IN 2ND BONDING STRENGTH | SUPPRESSION OF LEANING FAILURE | LINEARITY OF LOOP | PRESENCE/ABSENCE OF SPRING FAILURE |
|---|---|---|---|---|---|---|---|
| EXAMPLE 1 | X | 7 | ◎ | ○ | ◎ | ○ | ○ |
| EXAMPLE 2 | X | 8 | ◎ | ○ | ◎ | ○ | ○ |
| EXAMPLE 3 | ○ | 9 | ◎ | ◎ | ◎ | ◎ | ○ |
| EXAMPLE 4 | ○ | 20 | ◎ | ◎ | ◎ | ◎ | ○ |
| COMPARATIVE EXAMPLE 1 | X | 7 | ◎ | ○ | X | X | X |
| COMPARATIVE EXAMPLE 2 | X | 8 | ◎ | ○ | X | X | X |
| COMPARATIVE EXAMPLE 3 | X | 6 | X | X | X | X | X |
| COMPARATIVE EXAMPLE 4 | X | 21 | ◎ | X | X | X | X |

According to the examples 5 to 84 of the bonding wire of the present invention, because the range of the ratio of stress at 1% elongation with respect to the tensile strength and the range of the breaking elongation of the bonding wire were appropriate, and the composition of Au—Ag alloy was appropriate, no leaning failure occurred, and a sufficient 2nd bonding strength was ensured even through low temperature bonding of 150° C., and a spring failure was suppressed, and it was confirmed that the surface of the bonding wire was not sulfurized. In contrast, according to the bonding wire of comparative example 5, because stress at 1% elongation was small, a leaning failure occurred. According to the bonding wire of comparative example 6, although the range of the ratio of stress at 1% elongation with respect to the tensile strength was appropriate, the breaking elongation of the bonding wire was 6% which was small, the 2nd bonding strength was insufficient.

TABLE 2

| SAMPLE NO. | BONDING TEMPERATURE/ °C. | MAIN CONSTITUENT ELEMENT/ MASS % | TINY AMOUNT ADDITIVE ELEMENT/ MASS PPM | WIRE YIELD/% | RATIO OF STRESS AT 1% ELONGATION TO TENSILE STRENGTH | SLOPE BETWEEN ARBITRARY TWO POINT FROM 1% ELONGATION AND BREAKING ELONGATION |
|---|---|---|---|---|---|---|
| EXAMPLE 5 | 150 | Au—10% Ag | NONE | 97 | 90 | ○ |
| EXAMPLE 6 | 150 | Au—14% Ag | NONE | 98 | 90 | ○ |
| EXAMPLE 7 | 150 | Au—46% Ag | NONE | 95 | 90 | ○ |
| EXAMPLE 8 | 150 | Au—50% Ag | NONE | 95 | 90 | ○ |
| EXAMPLE 9 | 150 | Au—54% Ag | NONE | 95 | 90 | ○ |
| EXAMPLE 10 | 150 | Au—76% Ag | NONE | 95 | 90 | ○ |
| EXAMPLE 11 | 150 | Au—80% Ag | NONE | 96 | 90 | ○ |
| EXAMPLE 12 | 150 | Au—90% Ag | NONE | 96 | 90 | ○ |
| EXAMPLE 13 | 150 | Au—10% Ag | NONE | 94 | 99 | ○ |
| EXAMPLE 14 | 150 | Au—14% Ag | NONE | 98 | 99 | ○ |
| EXAMPLE 15 | 150 | Au—46% Ag | NONE | 95 | 99 | ○ |
| EXAMPLE 16 | 150 | Au—50% Ag | NONE | 95 | 99 | ○ |
| EXAMPLE 17 | 150 | Au—54% Ag | NONE | 95 | 99 | ○ |
| EXAMPLE 18 | 150 | Au—76% Ag | NONE | 94 | 99 | ○ |
| EXAMPLE 19 | 150 | Au—80% Ag | NONE | 94 | 99 | ○ |
| EXAMPLE 20 | 150 | Au—90% Ag | NONE | 94 | 99 | ○ |
| EXAMPLE 21 | 150 | Au—10% Ag | NONE | 96 | 90 | ○ |

TABLE 2-continued

| SAMPLE NO. | | | | | | |
|---|---|---|---|---|---|---|
| EXAMPLE 22 | 150 | Au—14% Ag | NONE | 97 | 90 | ○ |
| EXAMPLE 23 | 150 | Au—46% Ag | NONE | 95 | 90 | ○ |
| EXAMPLE 24 | 150 | Au—50% Ag | NONE | 95 | 90 | ○ |
| EXAMPLE 25 | 150 | Au—54% Ag | NONE | 95 | 90 | ○ |
| EXAMPLE 26 | 150 | Au—76% Ag | NONE | 92 | 90 | ○ |
| EXAMPLE 27 | 150 | Au—80% Ag | NONE | 92 | 90 | ○ |
| EXAMPLE 28 | 150 | Au—90% Ag | NONE | 92 | 90 | ○ |
| EXAMPLE 29 | 150 | Au—10% Ag | NONE | 97 | 96 | ○ |
| EXAMPLE 30 | 150 | Au—14% Ag | NONE | 94 | 96 | ○ |
| EXAMPLE 31 | 150 | Au—46% Ag | NONE | 96 | 96 | ○ |
| EXAMPLE 32 | 150 | Au—50% Ag | NONE | 98 | 96 | ○ |
| EXAMPLE 33 | 150 | Au—54% Ag | NONE | 96 | 96 | ○ |
| EXAMPLE 34 | 150 | Au—76% Ag | NONE | 95 | 96 | ○ |
| EXAMPLE 35 | 150 | Au—80% Ag | NONE | 95 | 96 | ○ |
| EXAMPLE 36 | 150 | Au—90% Ag | NONE | 95 | 96 | ○ |
| EXAMPLE 37 | 150 | Au—10% Ag | NONE | 97 | 98 | ○ |
| EXAMPLE 38 | 150 | Au—14% Ag | NONE | 98 | 98 | ○ |
| EXAMPLE 39 | 150 | Au—46% Ag | NONE | 94 | 98 | ○ |
| EXAMPLE 40 | 150 | Au—50% Ag | NONE | 94 | 98 | ○ |
| EXAMPLE 41 | 150 | Au—54% Ag | NONE | 94 | 98 | ○ |
| EXAMPLE 42 | 150 | Au—76% Ag | NONE | 92 | 98 | ○ |
| EXAMPLE 43 | 150 | Au—80% Ag | NONE | 92 | 98 | ○ |
| EXAMPLE 44 | 150 | Au—90% Ag | NONE | 92 | 98 | ○ |
| COMPARATIVE EXAMPLE 5 | 150 | Au—9% Ag | NONE | 91 | 89 | X |
| COMPARATIVE EXAMPLE 6 | 150 | Au—10% Ag | NONE | 90 | 90 | ○ |

| SAMPLE NO. | RATIO OF 0.2% PROOF STRESS TO TENSILE STRENGTH | WIRE BREAKING ELONGATION/% | 2ND BONDING STRENGTH | DISPERSION IN 2ND BONDING STRENGTH | SUPPRESSION OF LEANING FAILURE | PRESENCE/ ABSENCE OF SPRING FAILURE |
|---|---|---|---|---|---|---|
| EXAMPLE 5 | ○ | 7 | ⊚ | ○ | ⊚ | ○ |
| EXAMPLE 6 | ○ | 7 | ⊚ | ○ | ⊚ | ○ |
| EXAMPLE 7 | ○ | 7 | ⊚ | ○ | ⊚ | ○ |
| EXAMPLE 8 | ○ | 7 | ⊚ | ○ | ⊚ | ○ |
| EXAMPLE 9 | ○ | 7 | ⊚ | ○ | ⊚ | ○ |
| EXAMPLE 10 | ○ | 7 | ⊚ | ○ | ⊚ | ○ |
| EXAMPLE 11 | ○ | 7 | ⊚ | ○ | ⊚ | ○ |
| EXAMPLE 12 | ○ | 7 | ⊚ | ○ | ⊚ | ○ |
| EXAMPLE 13 | ○ | 8 | ⊚ | ○ | ⊚ | ○ |
| EXAMPLE 14 | ○ | 8 | ⊚ | ○ | ⊚ | ○ |
| EXAMPLE 15 | ○ | 8 | ⊚ | ○ | ⊚ | ○ |
| EXAMPLE 16 | ○ | 8 | ⊚ | ○ | ⊚ | ○ |
| EXAMPLE 17 | ○ | 8 | ⊚ | ○ | ⊚ | ○ |
| EXAMPLE 18 | ○ | 8 | ⊚ | ○ | ⊚ | ○ |
| EXAMPLE 19 | ○ | 8 | ⊚ | ○ | ⊚ | ○ |
| EXAMPLE 20 | ○ | 8 | ⊚ | ○ | ⊚ | ○ |
| EXAMPLE 21 | ○ | 9 | ⊚ | ⊚ | ⊚ | ○ |
| EXAMPLE 22 | ○ | 9 | ⊚ | ⊚ | ⊚ | ○ |
| EXAMPLE 23 | ○ | 9 | ⊚ | ⊚ | ⊚ | ○ |
| EXAMPLE 24 | ○ | 9 | ⊚ | ⊚ | ⊚ | ○ |
| EXAMPLE 25 | ○ | 9 | ⊚ | ⊚ | ⊚ | ○ |
| EXAMPLE 26 | ○ | 9 | ⊚ | ⊚ | ⊚ | ○ |
| EXAMPLE 27 | ○ | 9 | ⊚ | ⊚ | ⊚ | ○ |
| EXAMPLE 28 | ○ | 9 | ⊚ | ⊚ | ⊚ | ○ |
| EXAMPLE 29 | ○ | 15 | ⊚ | ⊚ | ⊚ | ○ |
| EXAMPLE 30 | ○ | 15 | ⊚ | ⊚ | ⊚ | ○ |
| EXAMPLE 31 | ○ | 15 | ⊚ | ⊚ | ⊚ | ○ |
| EXAMPLE 32 | ○ | 15 | ⊚ | ⊚ | ⊚ | ○ |
| EXAMPLE 33 | ○ | 15 | ⊚ | ⊚ | ⊚ | ○ |
| EXAMPLE 34 | ○ | 15 | ⊚ | ⊚ | ⊚ | ○ |
| EXAMPLE 35 | ○ | 15 | ⊚ | ⊚ | ⊚ | ○ |
| EXAMPLE 36 | ○ | 15 | ⊚ | ⊚ | ⊚ | ○ |
| EXAMPLE 37 | ○ | 20 | ⊚ | ⊚ | ⊚ | ○ |
| EXAMPLE 38 | ○ | 20 | ⊚ | ⊚ | ⊚ | ○ |
| EXAMPLE 39 | ○ | 20 | ⊚ | ⊚ | ⊚ | ○ |
| EXAMPLE 40 | ○ | 20 | ⊚ | ⊚ | ⊚ | ○ |
| EXAMPLE 41 | ○ | 20 | ⊚ | ⊚ | ⊚ | ○ |
| EXAMPLE 42 | ○ | 20 | ⊚ | ⊚ | ⊚ | ○ |
| EXAMPLE 43 | ○ | 20 | ⊚ | ⊚ | ⊚ | ○ |
| EXAMPLE 44 | ○ | 20 | ⊚ | ⊚ | ⊚ | ○ |
| COMPARATIVE EXAMPLE 5 | X | 7 | ○ | ○ | X | X |
| COMPARATIVE EXAMPLE 6 | ○ | 6 | Δ | Δ | ⊚ | ○ |

TABLE 2-continued

| SAMPLE NO. | WIRE SURFACE SULFIDIZATION/ OXIDIZATION | ELECTRIC RESISTIVITY | 1ST BONDING PART RELIABILITY | 1ST BONDING PART CIRCULARITY | 1ST BONDING PART BONDING STRENGTH |
|---|---|---|---|---|---|
| EXAMPLE 5 | ⊚ | ○ | Δ | ○ | ○ |
| EXAMPLE 6 | ⊚ | ○ | Δ | ○ | ○ |
| EXAMPLE 7 | ⊚ | ○ | Δ | ○ | ○ |
| EXAMPLE 8 | ⊚ | ○ | Δ | ○ | ○ |
| EXAMPLE 9 | ⊚ | ○ | Δ | ○ | ○ |
| EXAMPLE 10 | ○ | ⊚ | Δ | ○ | ○ |
| EXAMPLE 11 | ○ | ⊚ | Δ | ○ | ○ |
| EXAMPLE 12 | ○ | ⊚ | Δ | ○ | ○ |
| EXAMPLE 13 | ⊚ | ○ | Δ | ○ | ○ |
| EXAMPLE 14 | ⊚ | ○ | Δ | ○ | ○ |
| EXAMPLE 15 | ⊚ | ○ | Δ | ○ | ○ |
| EXAMPLE 16 | ⊚ | ○ | Δ | ○ | ○ |
| EXAMPLE 17 | ⊚ | ○ | Δ | ○ | ○ |
| EXAMPLE 18 | ○ | ⊚ | Δ | ○ | ○ |
| EXAMPLE 19 | ○ | ⊚ | Δ | ○ | ○ |
| EXAMPLE 20 | ○ | ⊚ | Δ | ○ | ○ |
| EXAMPLE 21 | ⊚ | ○ | Δ | ○ | ○ |
| EXAMPLE 22 | ⊚ | ○ | Δ | ○ | ○ |
| EXAMPLE 23 | ⊚ | ○ | Δ | ○ | ○ |
| EXAMPLE 24 | ⊚ | ○ | Δ | ○ | ○ |
| EXAMPLE 25 | ⊚ | ○ | Δ | ○ | ○ |
| EXAMPLE 26 | ○ | ⊚ | Δ | ○ | ○ |
| EXAMPLE 27 | ○ | ⊚ | Δ | ○ | ○ |
| EXAMPLE 28 | ○ | ⊚ | Δ | ○ | ○ |
| EXAMPLE 29 | ⊚ | ○ | Δ | ○ | ○ |
| EXAMPLE 30 | ⊚ | ○ | Δ | ○ | ○ |
| EXAMPLE 31 | ⊚ | ○ | Δ | ○ | ○ |
| EXAMPLE 32 | ⊚ | ○ | Δ | ○ | ○ |
| EXAMPLE 33 | ⊚ | ○ | Δ | ○ | ○ |
| EXAMPLE 34 | ○ | ⊚ | Δ | ○ | ○ |
| EXAMPLE 35 | ○ | ⊚ | Δ | ○ | ○ |
| EXAMPLE 36 | ○ | ⊚ | Δ | ○ | ○ |
| EXAMPLE 37 | ⊚ | ○ | Δ | ○ | ○ |
| EXAMPLE 38 | ⊚ | ○ | Δ | ○ | ○ |
| EXAMPLE 39 | ⊚ | ○ | Δ | ○ | ○ |
| EXAMPLE 40 | ⊚ | ○ | Δ | ○ | ○ |
| EXAMPLE 41 | ⊚ | ○ | Δ | ○ | ○ |
| EXAMPLE 42 | ○ | ⊚ | Δ | ○ | ○ |
| EXAMPLE 43 | ○ | ⊚ | Δ | ○ | ○ |
| EXAMPLE 44 | ○ | ⊚ | Δ | ○ | ○ |
| COMPARATIVE EXAMPLE 5 | ○ | ⊚ | Δ | ○ | ○ |
| COMPARATIVE EXAMPLE 6 | ○ | ⊚ | Δ | ○ | ○ |

According to the examples 45 to 59 of the bonding wire of the present invention, because the contained amount of Ag was optimized, oxidization and sulfidization of the surface of the bonding wire was suppressed well, and the electric resistivity was excellent.

TABLE 3

| SAMPLE NO. | BONDING TEMPERATURE/ ° C. | MAIN CONSTITUENT ELEMENT/ MASS % | TINY AMOUNT ADDITIVE ELEMENT/ MASS PPM | WIRE YIELD/% | RATIO OF STRESS AT 1% ELONGATION TO TENSILE STRENGTH | SLOPE BETWEEN ARBITRARY TWO POINTS FROM 1% ELONGATION AND BREAKING ELONGATION |
|---|---|---|---|---|---|---|
| EXAMPLE 45 | 150 | Au—55% Ag | NONE | 95 | 90 | ○ |
| EXAMPLE 46 | 150 | Au—65% Ag | NONE | 95 | 90 | ○ |
| EXAMPLE 47 | 150 | Au—75% Ag | NONE | 95 | 90 | ○ |
| EXAMPLE 48 | 150 | Au—55% Ag | NONE | 95 | 99 | ○ |
| EXAMPLE 49 | 150 | Au—65% Ag | NONE | 95 | 99 | ○ |
| EXAMPLE 50 | 150 | Au—75% Ag | NONE | 95 | 99 | ○ |
| EXAMPLE 51 | 150 | Au—55% Ag | NONE | 95 | 90 | ○ |
| EXAMPLE 52 | 150 | Au—65% Ag | NONE | 95 | 90 | ○ |
| EXAMPLE 53 | 150 | Au—75% Ag | NONE | 95 | 90 | ○ |
| EXAMPLE 54 | 150 | Au—55% Ag | NONE | 96 | 96 | ○ |
| EXAMPLE 55 | 150 | Au—65% Ag | NONE | 96 | 96 | ○ |

TABLE 3-continued

| EXAMPLE 56 | 150 | Au—75% Ag | NONE | 96 | 96 | ○ |
| EXAMPLE 57 | 150 | Au—55% Ag | NONE | 94 | 98 | ○ |
| EXAMPLE 58 | 150 | Au—65% Ag | NONE | 94 | 98 | ○ |
| EXAMPLE 59 | 150 | Au—75% Ag | NONE | 94 | 98 | ○ |

| SAMPLE NO. | RATIO OF 0.2% PROOF STRESS TO TENSILE STRENGTH | WIRE BREAKING ELONGATION/% | 2ND BONDING STRENGTH | DISPERSION IN 2ND BONDING STRENGTH | SUPPRESSION OF LEANING FAILURE | PRESENCE/ABSENCE OF SPRING FAILURE |
| --- | --- | --- | --- | --- | --- | --- |
| EXAMPLE 45 | ○ | 7 | ◎ | ○ | ◎ | ○ |
| EXAMPLE 46 | ○ | 7 | ◎ | ○ | ◎ | ○ |
| EXAMPLE 47 | ○ | 7 | ◎ | ○ | ◎ | ○ |
| EXAMPLE 48 | ○ | 8 | ◎ | ○ | ◎ | ○ |
| EXAMPLE 49 | ○ | 8 | ◎ | ○ | ◎ | ○ |
| EXAMPLE 50 | ○ | 8 | ◎ | ○ | ◎ | ○ |
| EXAMPLE 51 | ○ | 9 | ◎ | ◎ | ◎ | ○ |
| EXAMPLE 52 | ○ | 9 | ◎ | ◎ | ◎ | ○ |
| EXAMPLE 53 | ○ | 9 | ◎ | ◎ | ◎ | ○ |
| EXAMPLE 54 | ○ | 15 | ◎ | ◎ | ◎ | ○ |
| EXAMPLE 55 | ○ | 15 | ◎ | ◎ | ◎ | ○ |
| EXAMPLE 56 | ○ | 15 | ◎ | ◎ | ◎ | ○ |
| EXAMPLE 57 | ○ | 20 | ◎ | ◎ | ◎ | ○ |
| EXAMPLE 58 | ○ | 20 | ◎ | ◎ | ◎ | ○ |
| EXAMPLE 59 | ○ | 20 | ◎ | ◎ | ◎ | ○ |

| SAMPLE NO. | WIRE SURFACE SULFIDIZATION/OXIDIZATION | ELECTRIC RESISTIVITY | 1ST BONDING PART RELIABILITY | 1ST BONDING PART CIRCULARITY | 1ST BONDING PART BONDING STRENGTH |
| --- | --- | --- | --- | --- | --- |
| EXAMPLE 45 | ◎ | ◎ | △ | ○ | ○ |
| EXAMPLE 46 | ◎ | ◎ | △ | ○ | ○ |
| EXAMPLE 47 | ◎ | ◎ | △ | ○ | ○ |
| EXAMPLE 48 | ◎ | ◎ | △ | ○ | ○ |
| EXAMPLE 49 | ◎ | ◎ | △ | ○ | ○ |
| EXAMPLE 50 | ◎ | ◎ | △ | ○ | ○ |
| EXAMPLE 51 | ◎ | ◎ | △ | ○ | ○ |
| EXAMPLE 52 | ◎ | ◎ | △ | ○ | ○ |
| EXAMPLE 53 | ◎ | ◎ | △ | ○ | ○ |
| EXAMPLE 54 | ◎ | ◎ | △ | ○ | ○ |
| EXAMPLE 55 | ◎ | ◎ | △ | ○ | ○ |
| EXAMPLE 56 | ◎ | ◎ | △ | ○ | ○ |
| EXAMPLE 57 | ◎ | ◎ | △ | ○ | ○ |
| EXAMPLE 58 | ◎ | ◎ | △ | ○ | ○ |
| EXAMPLE 59 | ◎ | ◎ | △ | ○ | ○ |

According to the examples 60 to 84 of the bonding wire of the present invention, because the contained amount of Ag was optimized, a practically sufficient level of the reliability of a 1st bonding part was ensured. According to the examples 70 to 84 of the bonding wire of the present invention, the contained amount of Ag was further optimized, i.e., the contained amount of Ag was set to be greater than or equal to 20 mass % and less than or equal to 40 mass %, an excellent reliability of a 1st bonding part was ensured.

TABLE 4

| SAMPLE NO. | BONDING TEMPERATURE/°C. | MAIN CONSTITUENT ELEMENT/MASS % | TINY AMOUNT ADDITIVE ELEMENT/MASS PPM | RATIO OF STRESS AT 1% ELONGATION TO TENSILE STRENGTH | SLOPE BETWEEN ARBITRARY TWO POINTS FROM 1% ELONGATION AND BREAKING ELONGATION | RATIO OF 0.2% PROOF STRESS TO TENSILE STRENGTH | WIRE BREAKING ELONGATION/% | 2ND BONDING STRENGTH |
| --- | --- | --- | --- | --- | --- | --- | --- | --- |
| EXAMPLE 60 | 150 | Au—15% Ag | NONE | 90 | ○ | ○ | 7 | ◎ |
| EXAMPLE 61 | 150 | Au—20% Ag | NONE | 99 | ○ | ○ | 8 | ◎ |
| EXAMPLE 62 | 150 | Au—41% Ag | NONE | 90 | ○ | ○ | 7 | ◎ |
| EXAMPLE 63 | 150 | Au—45% Ag | NONE | 99 | ○ | ○ | 8 | ◎ |
| EXAMPLE 64 | 150 | Au—15% Ag | NONE | 90 | ○ | ○ | 9 | ◎ |
| EXAMPLE 65 | 150 | Au—18% Ag | NONE | 96 | ○ | ○ | 15 | ◎ |
| EXAMPLE 66 | 150 | Au—20% Ag | NONE | 98 | ○ | ○ | 20 | ◎ |
| EXAMPLE 67 | 150 | Au—41% Ag | NONE | 90 | ○ | ○ | 9 | ◎ |

TABLE 4-continued

| | | | | | | | | |
|---|---|---|---|---|---|---|---|---|
| EXAMPLE 68 | 150 | Au—43% Ag | NONE | 96 | ○ | ○ | 15 | ◎ |
| EXAMPLE 69 | 150 | Au—45% Ag | NONE | 98 | ○ | ○ | 20 | ◎ |
| EXAMPLE 70 | 150 | Au—21% Ag | NONE | 90 | ○ | ○ | 7 | ◎ |
| EXAMPLE 71 | 150 | Au—21% Ag | NONE | 99 | ○ | ○ | 8 | ◎ |
| EXAMPLE 72 | 150 | Au—30% Ag | NONE | 90 | ○ | ○ | 7 | ◎ |
| EXAMPLE 73 | 150 | Au—30% Ag | NONE | 99 | ○ | ○ | 8 | ◎ |
| EXAMPLE 74 | 150 | Au—40% Ag | NONE | 90 | ○ | ○ | 7 | ◎ |
| EXAMPLE 75 | 150 | Au—40% Ag | NONE | 99 | ○ | ○ | 8 | ◎ |
| EXAMPLE 76 | 150 | Au—21% Ag | NONE | 90 | ○ | ○ | 9 | ◎ |
| EXAMPLE 77 | 150 | Au—21% Ag | NONE | 96 | ○ | ○ | 15 | ◎ |
| EXAMPLE 78 | 150 | Au—21% Ag | NONE | 98 | ○ | ○ | 20 | ◎ |
| EXAMPLE 79 | 150 | Au—30% Ag | NONE | 90 | ○ | ○ | 9 | ◎ |
| EXAMPLE 80 | 150 | Au—30% Ag | NONE | 96 | ○ | ○ | 15 | ◎ |
| EXAMPLE 81 | 150 | Au—30% Ag | NONE | 98 | ○ | ○ | 20 | ◎ |
| EXAMPLE 82 | 150 | Au—40% Ag | NONE | 90 | ○ | ○ | 9 | ◎ |
| EXAMPLE 83 | 150 | Au—40% Ag | NONE | 96 | ○ | ○ | 15 | ◎ |
| EXAMPLE 84 | 150 | Au—40% Ag | NONE | 98 | ○ | ○ | 20 | ◎ |

| SAMPLE NO. | DISPERSION IN 2ND BONDING STRENGTH | SUPPRESSION OF LEANING FAILURE | PRESENCE/ ABSENCE OF SPRING FAILURE | WIRE SURFACE SULFIDIZATION/ OXIDIZATION | 1ST BONDING PART RELIABILITY | 1ST BONDING PART CIRCULARITY | 1ST BONDING PART BONDING STRENGTH | WIRE ELECTRIC RESISTIVITY |
|---|---|---|---|---|---|---|---|---|
| EXAMPLE 60 | ○ | ◎ | ○ | ◎ | ○ | ○ | ○ | ○ |
| EXAMPLE 61 | ○ | ◎ | ○ | ◎ | ○ | ○ | ○ | ○ |
| EXAMPLE 62 | ○ | ◎ | ○ | ◎ | ○ | ○ | ○ | ○ |
| EXAMPLE 63 | ○ | ◎ | ○ | ◎ | ○ | ○ | ○ | ○ |
| EXAMPLE 64 | ◎ | ◎ | ○ | ◎ | ○ | ○ | ○ | ○ |
| EXAMPLE 65 | ◎ | ◎ | ○ | ◎ | ○ | ○ | ○ | ○ |
| EXAMPLE 66 | ◎ | ◎ | ○ | ◎ | ○ | ○ | ○ | ○ |
| EXAMPLE 67 | ◎ | ◎ | ○ | ◎ | ○ | ○ | ○ | ○ |
| EXAMPLE 68 | ◎ | ◎ | ○ | ◎ | ○ | ○ | ○ | ○ |
| EXAMPLE 69 | ◎ | ◎ | ○ | ◎ | ○ | ○ | ○ | ○ |
| EXAMPLE 70 | ○ | ◎ | ○ | ◎ | ◎ | ○ | ○ | ○ |
| EXAMPLE 71 | ○ | ◎ | ○ | ◎ | ◎ | ○ | ○ | ○ |
| EXAMPLE 72 | ○ | ◎ | ○ | ◎ | ◎ | ○ | ○ | ○ |
| EXAMPLE 73 | ○ | ◎ | ○ | ◎ | ◎ | ○ | ○ | ○ |
| EXAMPLE 74 | ○ | ◎ | ○ | ◎ | ◎ | ○ | ○ | ◎ |
| EXAMPLE 75 | ○ | ◎ | ○ | ◎ | ◎ | ○ | ○ | ◎ |
| EXAMPLE 76 | ◎ | ◎ | ○ | ◎ | ◎ | ○ | ○ | ○ |
| EXAMPLE 77 | ◎ | ◎ | ○ | ◎ | ◎ | ○ | ○ | ○ |
| EXAMPLE 78 | ◎ | ◎ | ○ | ◎ | ◎ | ○ | ○ | ○ |
| EXAMPLE 79 | ◎ | ◎ | ○ | ◎ | ◎ | ○ | ○ | ○ |
| EXAMPLE 80 | ◎ | ◎ | ○ | ◎ | ◎ | ○ | ○ | ○ |
| EXAMPLE 81 | ◎ | ◎ | ○ | ◎ | ◎ | ○ | ○ | ○ |
| EXAMPLE 82 | ◎ | ◎ | ○ | ◎ | ◎ | ○ | ○ | ◎ |
| EXAMPLE 83 | ◎ | ◎ | ○ | ◎ | ◎ | ○ | ○ | ◎ |
| EXAMPLE 84 | ◎ | ◎ | ○ | ◎ | ◎ | ○ | ○ | ◎ |

According to the examples 85 to 101 of the bonding wire of the present invention, because an additive element was appropriately added, the circularity of a 1st bonding part was excellent. According to the bonding wires of comparative examples 7 to 10, because the contained amount of an additive element was excessive, the surface of the bonding wire was sulfurized.

TABLE 5

| SAMPLE NO. | BONDING TEMPERATURE/ ° C. | MAIN CONSTITUENT ELEMENT/ MASS % | TINY AMOUNT ADDITIVE ELEMENT/ MASS PPM | RATIO OF STRESS AT 1% ELONGATION TO TENSILE STRENGTH | SLOPE BETWEEN ARBITRARY TWO POINTS FROM 1% ELONGATION AND BREAKING ELONGATION | RATIO OF 0.2% PROOF STRESS TO TENSILE STRENGTH | WIRE BREAKING ELONGATION/ % |
|---|---|---|---|---|---|---|---|
| EXAMPLE 85 | 150 | Au—10% Ag | Cu: 2 | 90 | ○ | ○ | 7 |
| EXAMPLE 86 | 150 | Au—90% Ag | Cu: 10 | 90 | ○ | ○ | 7 |
| EXAMPLE 87 | 150 | Au—65% Ag | Cu: 100 | 90 | ○ | ○ | 7 |
| EXAMPLE 88 | 150 | Au—90% Ag | Cu: 10000 | 90 | ○ | ○ | 7 |
| EXAMPLE 89 | 150 | Au—15% Ag | Pr: 2 | 99 | ○ | ○ | 8 |
| EXAMPLE 90 | 150 | Au—20% Ag | Pr: 10 | 99 | ○ | ○ | 8 |
| EXAMPLE 91 | 150 | Au—41% Ag | Pr: 100 | 99 | ○ | ○ | 8 |
| EXAMPLE 92 | 150 | Au—45% Ag | Pr: 10000 | 99 | ○ | ○ | 8 |
| EXAMPLE 93 | 150 | Au—21% Ag | Ti: 2 | 90 | ○ | ○ | 9 |

TABLE 5-continued

| | | | | | | | |
|---|---|---|---|---|---|---|---|
| EXAMPLE 94 | 150 | Au—25% Ag | Ti: 10 | 90 | ○ | ○ | 9 |
| EXAMPLE 95 | 150 | Au—30% Ag | Ti: 100 | 90 | ○ | ○ | 9 |
| EXAMPLE 96 | 150 | Au—40% Ag | Ti: 10000 | 90 | ○ | ○ | 9 |
| EXAMPLE 97 | 150 | Au—10% Ag | V: 2 | 96 | ○ | ○ | 15 |
| EXAMPLE 98 | 150 | Au—90% Ag | V: 10 | 96 | ○ | ○ | 15 |
| EXAMPLE 99 | 150 | Au—65% Ag | V: 100 | 96 | ○ | ○ | 15 |
| EXAMPLE 100 | 150 | Au—90% Ag | V: 10000 | 96 | ○ | ○ | 15 |
| EXAMPLE 101 | 150 | Au—10% Ag | Cu: 2, Pr: 2 Ti: 2, V: 2 | 90 | ○ | ○ | 7 |
| COMPARATIVE EXAMPLE 7 | 150 | Au—10% Ag | Cu: 10100 | 90 | ○ | ○ | 7 |
| COMPARATIVE EXAMPLE 8 | 150 | Au—10% Ag | Cu: 10100 | 90 | ○ | ○ | 7 |
| COMPARATIVE EXAMPLE 9 | 150 | Au—10% Ag | Cu: 10100 | 90 | ○ | ○ | 7 |
| COMPARATIVE EXAMPLE 10 | 150 | Au—10% Ag | Cu: 10100 | 90 | ○ | ○ | 7 |

| SAMPLE NO. | 2ND BONDING STRENGTH | DISPERSION IN 2ND BONDING STRENGTH | SUPPRESSION OF LEANING FAILURE | PRESENCE/ ABSENCE OF SPRING FAILURE | WIRE SURFACE SULFIDIZATION/ OXIDIZATION | 1ST BONDING PART RELIABILITY | 1ST BONDING PART CIRCULARITY | 1ST BONDING PART BONDING STRENGTH |
|---|---|---|---|---|---|---|---|---|
| EXAMPLE 85 | ◉ | ○ | ◉ | ○ | ◉ | Δ | ◉ | ○ |
| EXAMPLE 86 | ◉ | ○ | ◉ | ○ | ○ | Δ | ◉ | ○ |
| EXAMPLE 87 | ◉ | ○ | ◉ | ○ | ◉ | Δ | ◉ | ○ |
| EXAMPLE 88 | ◉ | ○ | ◉ | ○ | ○ | Δ | ◉ | ○ |
| EXAMPLE 89 | ◉ | ○ | ◉ | ○ | ◉ | ○ | ◉ | ○ |
| EXAMPLE 90 | ◉ | ○ | ◉ | ○ | ◉ | ○ | ◉ | ○ |
| EXAMPLE 91 | ◉ | ○ | ◉ | ○ | ◉ | ○ | ◉ | ○ |
| EXAMPLE 92 | ◉ | ○ | ◉ | ○ | ◉ | ○ | ◉ | ○ |
| EXAMPLE 93 | ◉ | ◉ | ◉ | ○ | ◉ | ◉ | ◉ | ○ |
| EXAMPLE 94 | ◉ | ◉ | ◉ | ○ | ◉ | ◉ | ◉ | ○ |
| EXAMPLE 95 | ◉ | ◉ | ◉ | ○ | ◉ | ◉ | ◉ | ○ |
| EXAMPLE 96 | ◉ | ◉ | ◉ | ○ | ◉ | ◉ | ◉ | ○ |
| EXAMPLE 97 | ◉ | ◉ | ◉ | ○ | ◉ | Δ | ◉ | ○ |
| EXAMPLE 98 | ◉ | ◉ | ◉ | ○ | ○ | Δ | ◉ | ○ |
| EXAMPLE 99 | ◉ | ◉ | ◉ | ○ | ◉ | Δ | ◉ | ○ |
| EXAMPLE 100 | ◉ | ◉ | ◉ | ○ | ○ | Δ | ◉ | ○ |
| EXAMPLE 101 | ◉ | ○ | ◉ | ○ | ◉ | Δ | ◉ | ○ |
| COMPARATIVE EXAMPLE 7 | ◉ | ○ | ◉ | ○ | X | Δ | ◉ | ○ |
| COMPARATIVE EXAMPLE 8 | ◉ | ○ | ◉ | ○ | X | Δ | ◉ | ○ |
| COMPARATIVE EXAMPLE 9 | ◉ | ○ | ◉ | ○ | X | Δ | ◉ | ○ |
| COMPARATIVE EXAMPLE 10 | ◉ | ○ | ◉ | ○ | X | Δ | ◉ | ○ |

According to the examples 102 to 138 of the bonding wire of the present invention, because an additive element was appropriately added, the strength of a 1st bonding part was excellent. In contrast, according to the bonding wires of comparative examples 11 to 14, because the contained amount of an additive element was excessive, the surface of the bonding wire was sulfurized.

TABLE 6

| SAMPLE NO. | BONDING TEMPERATURE/ ° C. | MAIN CONSTITUENT ELEMENT/ MASS % | TINY AMOUNT ADDITIVE ELEMENT/ MASS PPM | RATIO OF STRESS AT 1% ELONGATION TO TENSILE STRENGTH | SLOPE BETWEEN ARBITRARY TWO POINTS FROM 1% ELONGATION AND BREAKING ELONGATION | RATIO OF 0.2% PROOF STRESS TO TENSILE STRENGTH | WIRE BREAKING ELONGATION/ % |
|---|---|---|---|---|---|---|---|
| EXAMPLE 102 | 150 | Au—10% Ag | Al: 2 | 90 | ○ | ○ | 7 |
| EXAMPLE 103 | 150 | Au—90% Ag | Co: 2 | 90 | ○ | ○ | 7 |
| EXAMPLE 104 | 150 | Au—15% Ag | Fe: 2 | 90 | ○ | ○ | 7 |
| EXAMPLE 105 | 150 | Au—45% Ag | Ge: 2 | 90 | ○ | ○ | 7 |
| EXAMPLE 106 | 150 | Au—21% Ag | Mn: 2 | 90 | ○ | ○ | 7 |
| EXAMPLE 107 | 150 | Au—40% Ag | Ca: 2 | 90 | ○ | ○ | 7 |
| EXAMPLE 108 | 150 | Au—65% Ag | Be: 2 | 90 | ○ | ○ | 7 |
| EXAMPLE 109 | 150 | Au—90% Ag | In: 2 | 90 | ○ | ○ | 7 |
| EXAMPLE 110 | 150 | Au—15% Ag | Hf: 2 | 90 | ○ | ○ | 7 |

TABLE 6-continued

| | | | | | | | |
|---|---|---|---|---|---|---|---|
| EXAMPLE 111 | 150 | Au—45% Ag | Pd: 2 | 90 | ○ | ○ | 7 |
| EXAMPLE 112 | 150 | Au—21% Ag | Pt: 2 | 90 | ○ | ○ | 7 |
| EXAMPLE 113 | 150 | Au—30% Ag | La: 2 | 90 | ○ | ○ | 7 |
| EXAMPLE 114 | 150 | Au—40% Ag | Al: 100000 | 99 | ○ | ○ | 8 |
| EXAMPLE 115 | 150 | Au—10% Ag | Co: 100000 | 99 | ○ | ○ | 8 |
| EXAMPLE 116 | 150 | Au—90% Ag | Fe: 100000 | 99 | ○ | ○ | 8 |
| EXAMPLE 117 | 150 | Au—15% Ag | Ge: 100000 | 99 | ○ | ○ | 8 |
| EXAMPLE 118 | 150 | Au—45% Ag | Mn: 100000 | 99 | ○ | ○ | 8 |
| EXAMPLE 119 | 150 | Au—21% Ag | Ca: 100000 | 99 | ○ | ○ | 8 |
| EXAMPLE 120 | 150 | Au—40% Ag | Be: 100000 | 99 | ○ | ○ | 8 |
| EXAMPLE 121 | 150 | Au—10% Ag | In: 100000 | 99 | ○ | ○ | 8 |
| EXAMPLE 122 | 150 | Au—90% Ag | Hf: 100000 | 99 | ○ | ○ | 8 |
| EXAMPLE 123 | 150 | Au—15% Ag | Pd: 100000 | 99 | ○ | ○ | 8 |
| EXAMPLE 124 | 150 | Au—45% Ag | Pt: 100000 | 99 | ○ | ○ | 8 |
| EXAMPLE 125 | 150 | Au—45% Ag | La: 100000 | 99 | ○ | ○ | 8 |
| EXAMPLE 126 | 150 | Au—21% Ag | Ge: 2, Hf: 2 P: 2 | 99 | ○ | ○ | 8 |
| EXAMPLE 127 | 150 | Au—40% Ag | Cu: 2 Al: 100 | 90 | ○ | ○ | 9 |
| EXAMPLE 128 | 150 | Au—10% Ag | Pr: 2 Co: 100 | 96 | ○ | ○ | 15 |
| EXAMPLE 129 | 150 | Au—90% Ag | Ti: 2 Fe: 100 | 90 | ○ | ○ | 9 |
| EXAMPLE 130 | 150 | Au—15% Ag | V: 2 Ge: 100 | 96 | ○ | ○ | 15 |
| EXAMPLE 131 | 150 | Au—45% Ag | Cu: 2 Mn: 100 | 90 | ○ | ○ | 9 |
| EXAMPLE 132 | 150 | Au—21% Ag | Pr: 2 Ca: 100 | 96 | ○ | ○ | 15 |
| EXAMPLE 133 | 150 | Au—40% Ag | Ti: 2 Be: 100 | 90 | ○ | ○ | 9 |
| EXAMPLE 134 | 150 | Au—65% Ag | V: 2 In: 100 | 96 | ○ | ○ | 15 |
| EXAMPLE 135 | 150 | Au—90% Ag | Cu: 2 Hf: 100 | 90 | ○ | ○ | 9 |
| EXAMPLE 136 | 150 | Au—15% Ag | Pr: 2 Pd: 100 | 96 | ○ | ○ | 15 |
| EXAMPLE 137 | 150 | Au—45% Ag | Ti: 2 Pt: 100 | 90 | ○ | ○ | 9 |
| EXAMPLE 138 | 150 | Au—45% Ag | Ti: 2 La: 100 | 90 | ○ | ○ | 9 |
| COMPARATIVE EXAMPLE 11 | 150 | Au—10% Ag | Al: 100100 | 90 | ○ | ○ | 7 |
| COMPARATIVE EXAMPLE 12 | 150 | Au—10% Ag | Co: 100100 | 90 | ○ | ○ | 7 |
| COMPARATIVE EXAMPLE 13 | 150 | Au—10% Ag | Fe: 100100 | 90 | ○ | ○ | 7 |
| COMPARATIVE EXAMPLE 14 | 150 | Au—10% Ag | Ge: 100100 | 90 | ○ | ○ | 7 |

| SAMPLE NO. | 2ND BONDING STRENGTH | DISPERSION IN 2ND BONDING STRENGTH | SUPPRESSION OF LEANING FAILURE | PRESENCE/ ABSENCE OF SPRING FAILURE | WIRE SURFACE SULFIDIZATION/ OXIDIZATION | 1ST BONDING PART RELIABILITY | 1ST BONDING PART CIRCULARITY | 1ST BONDING PART BONDING STRENGTH |
|---|---|---|---|---|---|---|---|---|
| EXAMPLE 102 | ⊚ | ○ | ⊚ | ○ | ⊚ | Δ | ○ | ⊚ |
| EXAMPLE 103 | ⊚ | ○ | ⊚ | ○ | ○ | Δ | ○ | ⊚ |
| EXAMPLE 104 | ⊚ | ○ | ⊚ | ○ | ⊚ | ⊚ | ○ | ⊚ |
| EXAMPLE 105 | ⊚ | ○ | ⊚ | ○ | ⊚ | ○ | ○ | ⊚ |
| EXAMPLE 106 | ⊚ | ○ | ⊚ | ○ | ⊚ | ⊚ | ○ | ⊚ |
| EXAMPLE 107 | ⊚ | ○ | ⊚ | ○ | ⊚ | ⊚ | ○ | ⊚ |
| EXAMPLE 108 | ⊚ | ○ | ⊚ | ○ | ⊚ | Δ | ○ | ⊚ |
| EXAMPLE 109 | ⊚ | ○ | ⊚ | ○ | ○ | Δ | ○ | ⊚ |
| EXAMPLE 110 | ⊚ | ○ | ⊚ | ○ | ⊚ | ○ | ○ | ⊚ |
| EXAMPLE 111 | ⊚ | ○ | ⊚ | ○ | ⊚ | ⊚ | ○ | ⊚ |
| EXAMPLE 112 | ⊚ | ○ | ⊚ | ○ | ⊚ | ⊚ | ○ | ⊚ |
| EXAMPLE 113 | ⊚ | ○ | ⊚ | ○ | ⊚ | ⊚ | ○ | ⊚ |
| EXAMPLE 114 | ⊚ | ○ | ⊚ | ○ | ⊚ | ⊚ | ○ | ⊚ |
| EXAMPLE 115 | ⊚ | ○ | ⊚ | ○ | ⊚ | Δ | ○ | ⊚ |
| EXAMPLE 116 | ⊚ | ○ | ⊚ | ○ | ⊚ | Δ | ○ | ⊚ |
| EXAMPLE 117 | ⊚ | ○ | ⊚ | ○ | ⊚ | ○ | ○ | ⊚ |
| EXAMPLE 118 | ⊚ | ○ | ⊚ | ○ | ⊚ | ○ | ○ | ⊚ |
| EXAMPLE 119 | ⊚ | ○ | ⊚ | ○ | ⊚ | ⊚ | ○ | ⊚ |
| EXAMPLE 120 | ⊚ | ○ | ⊚ | ○ | ⊚ | ⊚ | ○ | ⊚ |
| EXAMPLE 121 | ⊚ | ○ | ⊚ | ○ | ○ | Δ | ○ | ⊚ |
| EXAMPLE 122 | ⊚ | ○ | ⊚ | ○ | ○ | Δ | ○ | ⊚ |
| EXAMPLE 123 | ⊚ | ○ | ⊚ | ○ | ⊚ | ○ | ○ | ⊚ |
| EXAMPLE 124 | ⊚ | ○ | ⊚ | ○ | ⊚ | ○ | ○ | ⊚ |
| EXAMPLE 125 | ⊚ | ○ | ⊚ | ○ | ⊚ | ○ | ○ | ⊚ |

TABLE 6-continued

| | | | | | | | | |
|---|---|---|---|---|---|---|---|---|
| EXAMPLE 126 | ⊚ | ○ | ⊚ | ○ | ⊚ | ⊚ | ○ | ⊚ |
| EXAMPLE 127 | ⊚ | ⊚ | ⊚ | ○ | ⊚ | ⊚ | ⊚ | ⊚ |
| EXAMPLE 128 | ⊚ | ⊚ | ⊚ | ○ | ⊚ | Δ | ⊚ | ⊚ |
| EXAMPLE 129 | ⊚ | ⊚ | ⊚ | ○ | ○ | Δ | ⊚ | ⊚ |
| EXAMPLE 130 | ⊚ | ⊚ | ⊚ | ○ | ⊚ | ○ | ⊚ | ⊚ |
| EXAMPLE 131 | ⊚ | ⊚ | ⊚ | ○ | ⊚ | ○ | ⊚ | ⊚ |
| EXAMPLE 132 | ⊚ | ⊚ | ⊚ | ○ | ⊚ | ⊚ | ⊚ | ⊚ |
| EXAMPLE 133 | ⊚ | ⊚ | ⊚ | ○ | ⊚ | ⊚ | ⊚ | ⊚ |
| EXAMPLE 134 | ⊚ | ⊚ | ⊚ | ○ | ⊚ | Δ | ⊚ | ⊚ |
| EXAMPLE 135 | ⊚ | ⊚ | ⊚ | ○ | ○ | Δ | ⊚ | ⊚ |
| EXAMPLE 136 | ⊚ | ⊚ | ⊚ | ○ | ⊚ | ○ | ⊚ | ⊚ |
| EXAMPLE 137 | ⊚ | ⊚ | ⊚ | ○ | ⊚ | ○ | ⊚ | ⊚ |
| EXAMPLE 138 | ⊚ | ⊚ | ⊚ | ○ | ⊚ | ○ | ⊚ | ⊚ |
| COMPARATIVE EXAMPLE 11 | ⊚ | ○ | ⊚ | ○ | X | Δ | ○ | ⊚ |
| COMPARATIVE EXAMPLE 12 | ⊚ | ○ | ⊚ | ○ | X | Δ | ○ | ⊚ |
| COMPARATIVE EXAMPLE 13 | ⊚ | ○ | ⊚ | ○ | X | Δ | ○ | ⊚ |
| COMPARATIVE EXAMPLE 14 | ⊚ | ○ | ⊚ | ○ | X | Δ | ○ | ⊚ |

Figure 1:
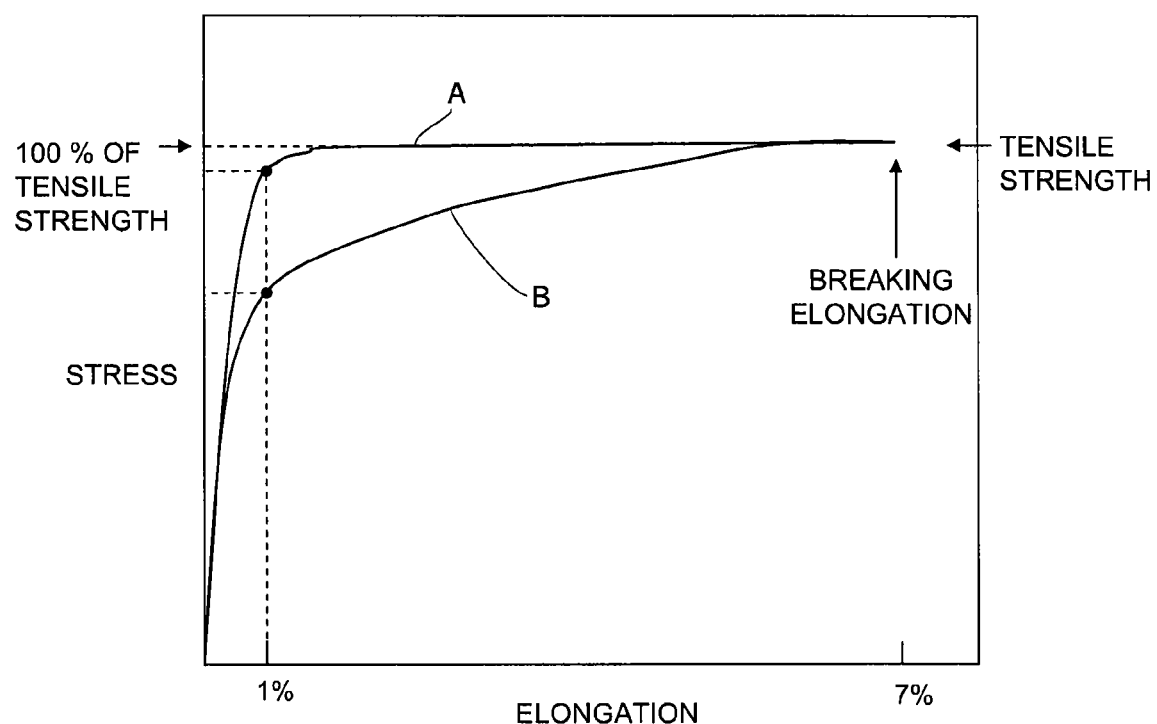
FIG. 1 is a graph schematically showing an example of a tensile curve of the bonding wire of the present invention (represented by A in the FIGURE), and an example of a tensile curve of conventional 4N-Au bonding wires and Au alloy bonding wires (represented by B in the FIGURE).

The invention claimed is:

1. A semiconductor mounting bonding wire having a breaking elongation of 7 to 20%, containing Ag of 10 to 90 mass %, wherein a balance comprises Au,
wherein said semiconductor mounting bonding wire is obtained by drawing an ingot of the wire at a reduction of area of 6 to 18%, and
wherein stress at 1% elongation is within a range from 90% of a tensile strength to 100% thereof.

2. The semiconductor mounting bonding wire according to claim 1, containing Ag of 15 to 45 mass %, and wherein a balance comprises Au.

3. The semiconductor mounting bonding wire according to claim 1, wherein a total amount of an additional one or greater than one elements selected from Al, Co, Fe, Ge, Mn, Ca, Be, In, Hf, Pd, La and Pt is/are present in a quantity of 2 to 100000 mass ppm.

4. A semiconductor device comprising a semiconductor mounting bonding wire according to claim 1, wherein the semiconductor mounting bonding wire is connected to a wiring electrode formed of Al or an Al alloy.

5. A semiconductor device comprising a semiconductor mounting bonding wire according to claim 1, wherein the semiconductor mounting bonding wire connects a wiring electrode on a semiconductor substrate with a Ag plating surface or a Pd plating surface on a lead.

6. The semiconductor mounting bonding wire according to claim 2, wherein a total amount of an additional one or greater than one elements selected from Al, Co, Fe, Ge, Mn, Ca, Be, In, Hf, Pd, La, and Pt is/are present in a quantity of 2 to 100000 mass ppm.

7. A semiconductor device comprising a semiconductor mounting bonding wire according to claim 2, wherein the semiconductor mounting bonding wire is connected to a wiring electrode formed of Al or an Al alloy.

8. A semiconductor device comprising a semiconductor mounting bonding wire according to claim 3, wherein the semiconductor mounting bonding wire is connected to a wiring electrode formed of Al or an Al alloy.

9. A semiconductor device comprising a semiconductor mounting bonding wire according to claim 6, wherein the semiconductor mounting bonding wire is connected to a wiring electrode formed of Al or an Al alloy.

10. A semiconductor device comprising a semiconductor mounting bonding wire according to claim 2, wherein the semiconductor mounting bonding wire connects a wiring electrode on a semiconductor substrate with a Ag plating surface of a Pd plating surface on a lead.

11. A semiconductor device comprising a semiconductor mounting bonding wire according to claim 3, wherein the semiconductor mounting bonding wire connects a wiring electrode on a semiconductor substrate with a Ag plating surface or a Pd plating surface on a lead.

12. A semiconductor device comprising a semiconductor mounting bonding wire according to claim 6, wherein the semiconductor mounting bonding wire connects a wiring electrode on a semiconductor substrate with a Ag plating surface or a Pd plating surface on a lead.

13. The semiconductor mounting bonding wire according to claim 1, wherein a slope S between arbitrary two points in an area from 1% elongation to the breaking elongation in a tensile curve is within a range $0 \text{ (horizontal)} \leq S \leq (0.1 \times \sigma_M)/(EL-1)$, said $\sigma_M$ being the tensile strength of the bonding wire, said EL being the breaking elongation of the bonding wire.

14. The semiconductor mounting bonding wire according to claim 1, wherein the bonding wire has stress at 1% elongation within a range from 90% to 100% of a tensile strength, and 0.2% proof stress in a tensile curve greater than or equal to 80% and less than or equal to 100% of the tensile strength.

15. The semiconductor mounting bonding wire according to claim 13, containing Ag of 55 to 75 mass %.

16. The semiconductor mounting bonding wire according to claim 14, containing Ag of 55 to 75 mass %.

17. The semiconductor mounting bonding wire according to claim 1, wherein in a case of wire drawing for a wire diameter of greater than or equal to 100 μm, wire drawing is carried out at the reduction of area of a die being set to 10 to 18%, while in a case of wire drawing for a wire diameter of less than 100 μm, the reduction of area is set to about 6 to 14%.

* * * * *